United States Patent
Endo et al.

(10) Patent No.: US 6,676,726 B1
(45) Date of Patent: Jan. 13, 2004

(54) METHOD AND APPARATUS FOR MANUFACTURING MINUTE METALLIC SPHERE

(75) Inventors: Michio Endo, Chiba (JP); Masamoto Tanaka, Chiba (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/471,181

(22) Filed: Dec. 23, 1999

(30) Foreign Application Priority Data

Dec. 25, 1998 (JP) .......................................... 10-370407

(51) Int. Cl.⁷ .................................................. B22F 9/06
(52) U.S. Cl. ............................ 75/331; 75/334; 75/340
(58) Field of Search ......................... 75/331, 334, 335, 75/337, 338, 340, 341

(56) References Cited

U.S. PATENT DOCUMENTS

| | | | | |
|---|---|---|---|---|
| 3,663,206 A | * | 5/1972 | Lubanska | 75/337 |
| 5,346,530 A | * | 9/1994 | Miller et al. | 75/331 |
| 5,653,783 A | * | 8/1997 | Ohzeki | 75/340 |
| 5,713,981 A | * | 2/1998 | Amick | 75/340 |
| 5,891,212 A | * | 4/1999 | Tang et al. | 75/335 |
| 6,290,745 B1 | * | 9/2001 | Schulze et al. | 75/335 |
| 6,432,330 B1 | * | 8/2002 | Hanabe et al. | 75/340 |

FOREIGN PATENT DOCUMENTS

| | | | |
|---|---|---|---|
| EP | 325798 | * | 8/1989 |
| JP | 4-74801 | | 3/1992 |
| JP | 11-264004 | * | 9/1999 |

* cited by examiner

Primary Examiner—George Wyszomierski
(74) Attorney, Agent, or Firm—Connolly Bove Lodge & Hutz LLP

(57) ABSTRACT

A manufacturing method of minute metallic spheres of the present invention comprises a heating means for heating and melting a metal to form a metallic sphere, a measurement means for measuring the injected molten metal into a predetermined volume, and a cooling means for cooling the molten metal discharged from the measurement means, to a temperature less than the melting point. The measurement means has a gauger of a predetermined volume in which the molten metal is injected, and is constructed such that the molten metal is cut by rubbing by the predetermined volume by sliding this gauger in contact. The molten metal is injected in the gauger of the predetermined volume to measure, and the measured molten metal is discharged from the gauger to cool to a temperature less than the melting point, and solidified into a sphere in the cooling process.

8 Claims, 22 Drawing Sheets

| kind of oil | 40°C viscosity | 100°C viscosity | 200°C viscosity | viscosity index |
|---|---|---|---|---|
| ① | 395 cSt | 40.0 cSt | 6.4 cSt | 149 |
| ② | 109.9 cSt | 23.53 cSt | 5.858 cSt | 246 |
| ③ | 149.8 cSt | 31.71 cSt | 7.63 cSt | 255 |

| kind of oil | 40°C viscosity | 100°C viscosity | 200°C viscosity | viscosity index |
|---|---|---|---|---|
| ④ | 41.4 cSt | 4.5 cSt | 1.0 cSt | 99 |

METHOD AND APPARATUS FOR MANUFACTURING MINUTE METALLIC SPHERE

BACKGROUND OF THE INVENTION

1. Field of the Invention

The present invention relates to a method and an apparatus for manufacturing minute metallic spheres suitably used for forming a ball bump on an electrode of a semiconductor device, a printed circuit board, or the like.

2. Description of the Related Art

As methods of manufacturing minute metallic spheres within low-melting temperature, there are atomization method and a method of obtaining metallic spheres by dipping a metallic piece made into a predetermined volume in advance, in a heated liquid.

Besides, in the method described in Japanese Patent Application Laid-open No. 4-74801, a molten metal is extruded from very fine particles in a liquid heated to a temperature more than the melting point of the metal.

Although a large quantity of metallic particles can be obtained for a short time by the atomization method, it is difficult to make the shapes of the particles uniform in sphere and into an aimed size, and the yield becomes very bad. By the method of dropping a metallic piece in the heated liquid, it can be made into a substantially complete sphere by surface tension. But, for making the sizes of metallic pieces to be dropped, uniform in advance, there are some required processes of press-punching a plate made very thin by rolling or the like, or of making into a fine line with a die or the like and accurately cutting with a cutter or the like.

Besides, in that described in the Japanese Patent Application Laid-open No. 4-74801, the interior of a vertical tube is filled with a natural oil or the like, and a zone or a region having a temperature range more than the melting point of a metal is provided by a heater attached to the upper portion of the vertical tube. And, a low-melting alloy supply tube to which a fine grating is attached in that region, is stood such that the fine grating is at the lower position. A lump of a low-melting alloy is inserted in the low-melting alloy supply tube and molten, and an inert gas is fed through the upper portion of the low-melting alloy supply tube. Molten alloy is extruded from the fine grating by the pressure of the gas and made into particles, and they become spherical shape by passing through the temperature inclination of the vertical tube.

However, in the method described in this official gazette, the relation between the grating size and the pressurizing force, or the like, is unknown. In any case, the shape of a particle is made by the surface tension in a delicate balance relation to such a factor. In this method, so-called duplex grain can not be avoided.

SUMMARY OF THE INVENTION

In consideration of such an actual condition, the present invention aims to provide a method and an apparatus for manufacturing minute metallic spheres, capable of accurately and efficiently manufacturing minute metallic spheres of a predetermined size.

A manufacturing method of minute metallic spheres of the present invention is a manufacturing method of minute metallic spheres for manufacturing minute metallic spheres of a predetermined size, wherein a minute metallic sphere is formed by injecting a molten metal in a gauger of a predetermined volume to measure, and discharging the measured molten metal from the gauger to solidify.

A manufacturing method of minute metallic spheres of the present invention is a manufacturing method of minute metallic spheres for manufacturing minute metallic spheres of a predetermined size, including a step of heating and melting, a metal to form a metallic sphere, and injecting the molten metal in a gauger, a step of taking by rubbing the molten metal injected in said gauger by a predetermined volume to measure, and a step of discharging the measured molten metal from the gauger, and cooling the molten metal to a temperature less than the melting point to solidify.

A manufacturing apparatus of minute metallic spheres of the present invention is a manufacturing apparatus of minute metallic spheres for manufacturing minute metallic spheres of a predetermined size, comprising a heating means for heating and melting a metal to form a metallic sphere, a measurement means for measuring the injected molten metal into a predetermined volume, and a cooling means for cooling said molten metal discharged from said gauger, to a temperature less than the melting point.

A manufacturing method of minute metallic spheres of the present invention is a manufacturing method of minute metallic spheres for manufacturing minute metallic spheres of a predetermined size, wherein a minute metallic sphere is formed by discharging a molten metal from an opening portion, and dividing said molten metal discharged from said opening portion into each predetermined volume.

A manufacturing method of minute metallic spheres of the present invention is a manufacturing method of minute metallic spheres for manufacturing minute metallic spheres of a predetermined size, having a step of heating and melting a metal to form a metallic sphere, and discharging the molten metal from an opening portion, a step of dividing said molten metal discharged from said opening portion into each predetermined volume, and a step of cooling said molten metal divided to a temperature less than the melting point to solidify.

A manufacturing apparatus of minute metallic spheres of the present invention is a manufacturing apparatus of minute metallic spheres for manufacturing minute metallic spheres of a predetermined size, comprising a heating means for heating and melting a metal to form a metallic sphere, a means for discharging the molten metal from a predetermined opening portion, a division means for dividing said molten metal having passed through said opening part, and a cooling means for cooling said molten metal divided by said division means, to a temperature less than the melting point.

A manufacturing method of minute metallic spheres of the present invention is a manufacturing method of minute metallic spheres for manufacturing minute metallic spheres of a predetermined size, including a step of heating and melting a metal to form a metallic sphere, and injecting the molten metal in a measurement means by pressurizing, a step of cutting by rubbing the molten metal injected in the measurement means by a predetermined volume to measure, and a step of discharging the measured molten metal from the measurement means by a fluid pressure, and cooling the molten metal to a temperature less than the melting point to solidify.

A manufacturing apparatus of minute metallic spheres of the present invention is a manufacturing apparatus of minute metallic spheres for manufacturing minute metallic spheres of a predetermined size, comprising a heating means for heating and melting a metal to form a metallic sphere, a metal supply means for pressurizing and supplying the molten metal by the heating means, a measurement means supported so as to be rotatable relatively to said metal supply means, for measuring the injected molten metal into a predetermined volume by its rotational action, and a cooling means for cooling said molten metal discharged from said measurement means, to a temperature less than the melting point.

A manufacturing apparatus of minute metallic spheres of the present invention is a manufacturing apparatus of minute metallic spheres having a measurement unit in an upper portion of an oil vessel disposed vertically, for forming a minute metallic sphere by solidifying a molten metal discharged from this measurement unit, in an oil, wherein it has one or a plurality of cooling means in the lower part of said measurement unit, and a lower portion of said oil vessel is cooled.

A manufacturing method of minute metallic spheres of the present invention is a manufacturing method of minute metallic spheres having a measurement unit in an upper portion of an oil vessel disposed vertically, for forming a minute metallic sphere by solidifying a molten metal discharged from this measurement unit, in an oil, wherein one or a plurality of regions in the lower part of said oil vessel is cooled, and the oil in each region is set and kept at a predetermined temperature.

A manufacturing apparatus of minute metallic spheres of the present invention is a manufacturing apparatus of minute metallic spheres having a measurement unit in an upper portion of an oil vessel disposed vertically, for forming a minute metallic sphere by solidifying a molten metal discharged from this measurement unit, in an oil, having one or a plurality of moving-flow regulation means for physically regulating a convection of said oil in the oil vessel in the lower part of said measurement unit.

A manufacturing method of minute metallic spheres of the present invention is a manufacturing method of minute metallic spheres having a measurement unit in an upper portion of an oil vessel disposed vertically, for forming a minute metallic sphere by solidifying a molten metal discharged from this measurement unit, in an oil, wherein a convection of the oil in the oil vessel is physically regulated in one or a plurality of portions in the lower part of said measurement unit, and the oil in each region regulated is set and kept at a predetermined temperature.

A manufacturing apparatus of minute metallic spheres of the present invention is a manufacturing apparatus of minute metallic spheres having a measurement unit in an upper portion of an oil vessel disposed vertically, for forming a minute metallic sphere by solidifying a molten metal discharged from this measurement unit, in an oil, having a dispersion means for dispersing the molten metal, in the lower part of said measurement unit.

A manufacturing method of minute metallic spheres of the present invention is a manufacturing method of minute metallic spheres having a measurement unit in an upper portion of an oil vessel disposed vertically, for forming a minute metallic sphere by solidifying a molten metal discharged from this measurement unit, in an oil, wherein, in the lower part of said measurement unit, the molten metal discharged from the measurement unit, is dispersed.

A manufacturing apparatus of minute metallic spheres of the present invention is a manufacturing apparatus of minute metallic spheres having a measurement unit in an upper portion of an oil vessel disposed vertically, for forming a minute metallic sphere by solidifying a molten metal discharged from this measurement unit, in an oil, comprising a molten metal supply apparatus for supplying a molten metal from which inclusions have been removed, to the measurement unit.

A manufacturing apparatus of minute metallic spheres of the present invention is a manufacturing apparatus of minute metallic spheres having a measurement unit in an upper portion of a vessel disposed vertically, for forming a minute metallic sphere by solidifying a molten metal discharged from this measurement unit, in a cooling medium put in the vessel, wherein said cooling medium comprises an inert high-molecular liquid, an inert high-molecular steam and an inert gas.

A manufacturing apparatus of minute metallic spheres of the present invention is a manufacturing apparatus of minute metallic spheres having a measurement unit in an upper portion of a vessel disposed vertically, for forming a minute metallic sphere by solidifying a molten metal discharged from this measurement unit, in a cooling medium put in the vessel, wherein said cooling medium comprises an oil, and an inert high-molecular liquid put in the lower part of the oil.

A manufacturing method of minute metallic spheres of the present invention is a manufacturing method of minute metallic spheres having a measurement unit in an upper portion of a vessel disposed vertically in which a cooling medium is put, for forming a minute metallic sphere by solidifying a molten metal discharged from this measurement unit, in the cooling medium put in the vessel, wherein an inert high-molecular liquid, an inert high-molecular steam and an inert gas are used as said cooling medium, and said molten metal is cooled by said cooling medium to solidify.

A manufacturing apparatus of minute metallic spheres of the present invention is a manufacturing apparatus of minute metallic spheres having a measurement unit in an upper portion of a vessel disposed vertically, for forming a minute metallic sphere by solidifying a molten metal discharged from this measurement unit, in a cooling medium put in the vessel, wherein the viscosity of said cooling medium is kept into 2 cSt to 20 cSt at the temperature of 200° C. at which said molten metal is melted, and the dropping speed of said molten metal in said cooling medium is decreased by the viscosity of said cooling medium.

A manufacturing method of minute metallic spheres of the present invention is a manufacturing method of minute metallic spheres in which a measured molten metal is discharged in a vessel disposed vertically in which a cooling medium is put, and a minute metallic sphere is formed by solidifying said molten metal in said cooling medium, wherein the viscosity of said cooling medium is kept into 2 cSt to 20 cSt at the temperature of 200° C. at which said molten metal is melted, and the dropping speed of said molten metal in said cooling medium is decreased by the viscosity of said cooling medium.

A semiconductor device according to the present invention is a semiconductor device in which a semiconductor chip and a substrate are electrically connected by minute metallic spheres of a predetermined size, wherein said minute metallic spheres are formed by injecting a molten metal in a gauger of a predetermined volume to measure, and discharging the measured molten metal from the gauger to solidify.

A semiconductor device according to the present invention is a semiconductor device in which a semiconductor chip and a substrate are electrically connected by minute metallic spheres of a predetermined size, wherein said minute metallic spheres are manufactured by a method including a step of heating and melting a metal to form a metallic sphere, and injecting the molten metal in a gauger, a step of cutting by rubbing the molten metal injected in said gauger by a predetermined volume to measure, and a step of discharging the measured molten metal from the gauger, and cooling the molten metal to a temperature less than the melting point to solidify.

According to the present invention, by heating and melting a metal to form a metallic sphere, by a heating means, injecting this molten metal in a gauger of a predetermined volume, and sliding this gauger in contact, it can be measured accurately. Further, this measured molten metal is discharged from the gauger as it is in the molten state, and cooled by a cooling means to a temperature less than the melting point. The molten metal after measurement solidifies into a sphere by surface tension in the cooling process, and thereby, a minute metallic sphere of a predetermined size and shape can be obtained with high accuracy.

According to the present invention, minute metallic spheres of this kind can be manufactured accurately and efficiently. Although controllability for making the diameters of metallic spheres uniform and mass-productivity in manufacture are not compatible hitherto, mass production can be made efficiently with high dimensional accuracy, using the present invention. Because metallic spheres of an aimed diameter can thus be obtained efficiently, the productivity can be improved considerably.

According to the present invention, minute metallic spheres of a predetermined size can be manufactured accurately and efficiently. Accordingly, metallic spheres having a desired diameter can be obtained efficiently, and the productivity can be improved considerably.

According to the present invention, a metal to form a metallic sphere is heated and melted by a heating means, and this molten metal is injected in a measurement means of a predetermined volume. In this case, it is pressurized and supplied at a high pressure from one side of the measurement means, and the other side opposite to it is set to a low pressure, and, by sliding this measurement means in contact, it can be measured accurately. Further, this measured molten metal is discharged from the measurement means as it is in the molten state, and cooled by a cooling means to a temperature less than the melting point. The molten metal after measurement solidifies into a sphere shape by surface tension in the cooling process, and thereby, a minute metallic sphere of a predetermined size and shape can be obtained with high accuracy.

According to the present invention, by setting/keeping properly the oil temperature in an oil vessel, and cooling/solidifying a molten metal, a minute metallic sphere of good quality can be obtained. Besides, by dispersing the molten metal, the temperature distribution is made stable, and molten metals are prevented from uniting with each other, and a minute metallic sphere of good quality can be formed efficiently.

According to the present invention, by discharging a molten metal in an inert high-molecular liquid as a cooling medium, cleaning after solidifying can easily be performed, and it becomes possible to simplify the cleaning process.

According to the present invention, it becomes possible to lower the dropping speed of a discharged molten metal. Accordingly, it becomes possible to manufacture minute metallic spheres whose sphericity has been improved.

According to the present invention, by forming minute metallic spheres by the above-described manufacturing methods and apparatus, and using them for connecting a chip and a substrate in a semiconductor device, miniaturization of the package of the semiconductor device can be attained, and the cost can be lowered.

DETAILED DESCRIPTION OF THE PREFERRED EMBODIMENTS

First Embodiment

Hereinafter, a preferred embodiment of method and apparatus for manufacturing minute metallic spheres according to the present invention will be described on the basis of drawings.

Here, first, a minute metallic sphere in this embodiment is an example made of, e.g., solder in particular. In manufacturing process of a semiconductor device, in order to connect an electrode portion of a semiconductor element and an external circuit or the like, both are joined through a bump made of a minute metallic sphere. This minute metallic sphere suitable for the bump is an object, and, in particular, one having a diameter size of hundreds μm or less is obtained.

Figure 1:
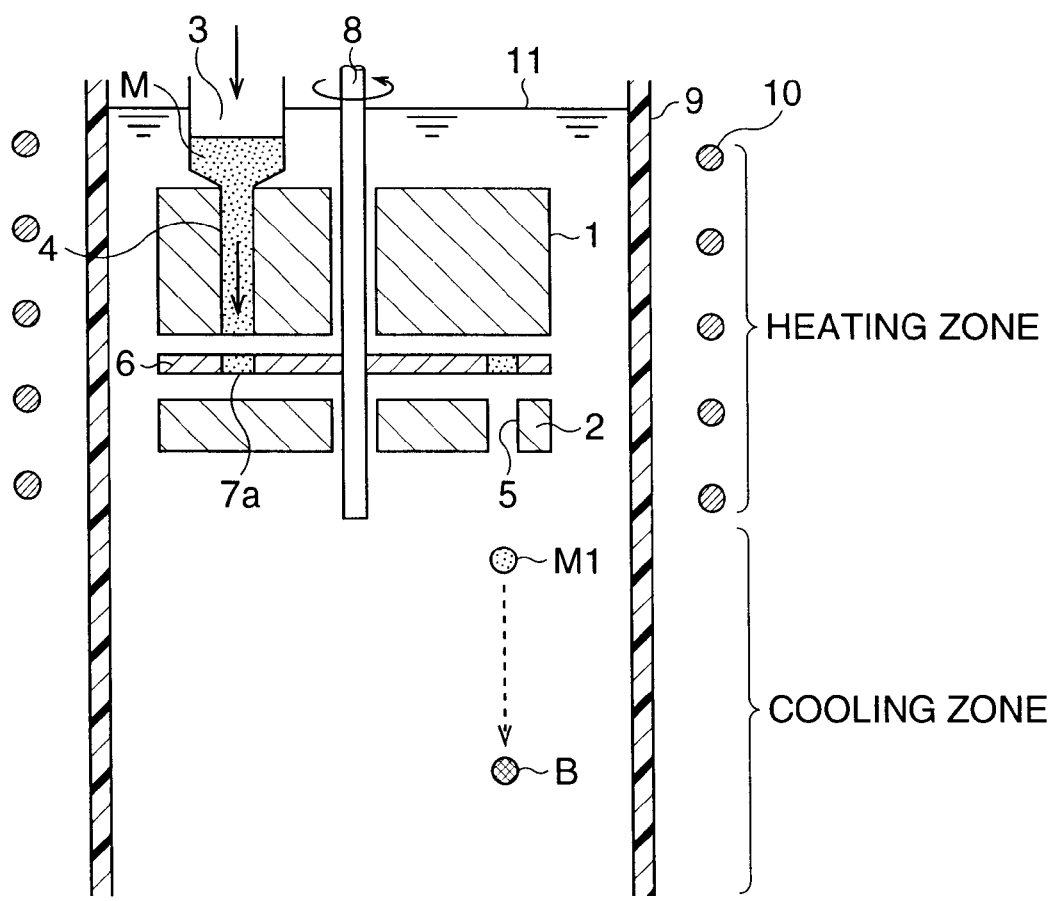
FIG. 1 is a sectional view showing an example of a schematic construction of a manufacturing apparatus of minute metallic spheres according to the first embodiment of the present invention.

FIG. 1 shows an example of a schematic construction of a manufacturing apparatus of minute metallic spheres used in a method of the present invention. In this drawing, 1 and 2 denote upper and lower blocks for supplying and discharging a molten metal M, 3 denotes a metal throwing-in portion, 4 denotes an injection passage formed in the upper block 1, and 5 denotes a discharge port for the molten metal M formed in the lower block 2.

In this example, the upper and lower blocks 1 and 2 are, e.g., circular (see FIG. 2), and fixed to predetermined positions in the apparatus. The upper and lower blocks 1 and 2 are suitably made of a material such as a metal, a resin, or a ceramic, that is not wetted with solder. Or, a coating such as Teflon may be made on the surfaces of ones made of those materials, and further it is preferable to have a thermal resistance and not to deform with heat.

Figure 2:
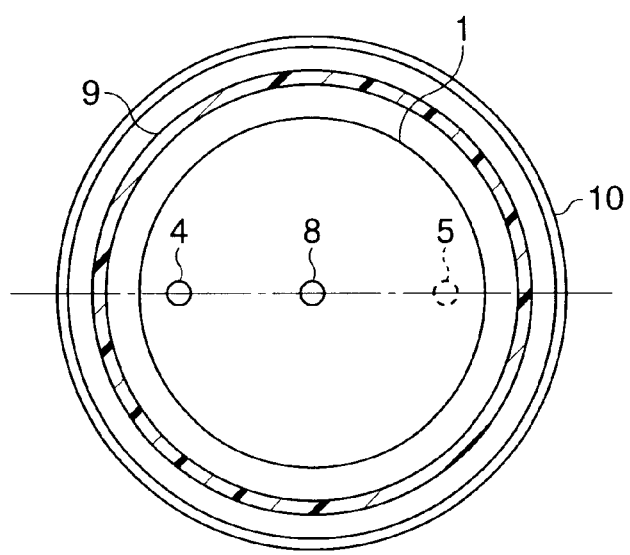
FIG. 2 is a plan view of the manufacturing apparatus of minute metallic spheres according to the first embodiment of the present invention.

As an example of the simplest construction, the injection passage 4 and the discharge port 5 may be disposed oppositely in a diameter direction as shown in FIG. 2.

Figure 3:
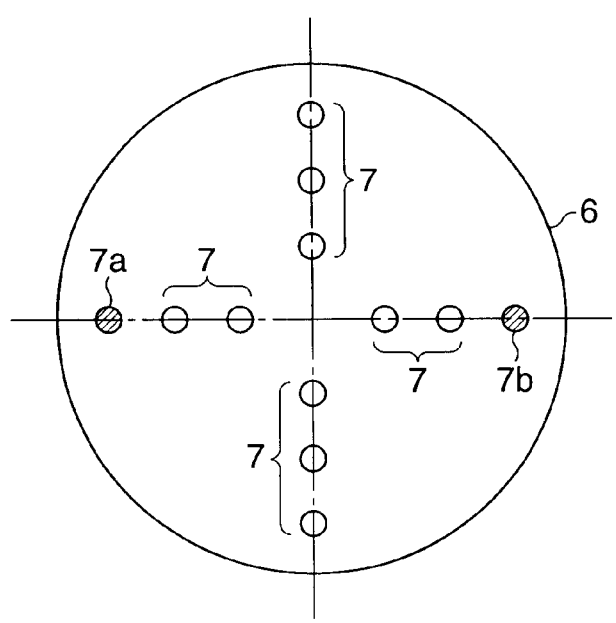
FIG. 3 is a sectional view showing an example of a schematic construction of a gauger according to the first embodiment of the present invention.

6 denotes a gauger set between the upper and lower blocks 1 and 2 so as to be rotatable, and 7 denotes a gauging portion provided in the gauger 6. As an example of the simplest construction, it may have gauging portions 7a and 7b disposed oppositely in a diameter direction as shown in FIG. 3. The gauging portions 7a and 7b are precisely formed so as to have predetermined volumes. 8 denotes a support shaft for driving the rotation of the gauger 6.

In this example, the gauger 6 is suitably made of a material such as a metal, a resin, or a ceramic, that is not wetted with solder, into a thin disklike shape. Besides, in the gauger 6, a coating such as Teflon may be made on the surfaces of ones made of those materials, and further it is preferable to have a thermal resistance and not to deform with heat. As for the material for making the gauger 6, or the like, may be the same as that for the upper and lower blocks 1 and 2, but it is not always necessary to made of the same material. When the gauger 6 is set between the upper and lower blocks 1 and 2, it is set closely without vertical spaces and to be rotatable. The gauging portions 7a and 7b are formed to penetrate the disk of the gauger 6 at positions that can correspond to the injection passage 4 and the discharge port 5, respectively.

Here, other than the case that a pair of gauging portions 7a and 7b is provided so as to be disposed oppositely as shown in FIG. 3, a plurality of lines or a plurality of pairs can be provided in relation to a circumferential direction (the circumference is divided into four in the example shown in the drawing) and/or a radial direction (three lines in the example shown in the drawing). In such a case of providing a plurality of gauging portions 7, a plurality of injection portions 4 and a plurality of discharge portions 5 are provided in a form corresponding to the configuration of the gauging portions 7.

The upper and lower blocks 1 and 2 and parts attendant upon them are accommodated in a vessel (made of glass or the like) 9 in a united form, as shown in FIG. 1. Around the vessel 9, a heating coil 10 is disposed as a heating means for heating and melting a metal to form metallic spheres. Besides, the interior of the vessel 9 is formed as a fluid tank.

In this example, an oil 11 is stored as a cooling means for cooling the molten metal M discharged from the gauger 6 to a temperature less than the melting point.

The heating coil 10 may be, e.g., a high-frequency coil or the like, and heats metal thrown in through the metal throwing-in portion 3 and keeps it in the state of the molten metal M. The corresponding portion in the vessel 9 to the heating coil 10 is thus set into a heating zone or region. Besides, a portion in the vessel 9 distant downward from the heating coil 10 is set into a cooling zone or region. By thus providing the heating and cooling zones vertically, a temperature gradient is formed in the vessel 9.

In the above construction, metal thrown in through the metal throwing-in portion 3 becomes the state of the molten metal M in the injection passage 4 by the heating coil 10. The molten metal M is injected into the gauging portion 7a positioned just below the injection passage 4 as shown in FIG. 1. When the gauging portion 7a is filled with the molten metal M, then the gauger 6 is driven to rotate by the support shaft 8. At this time, the upper and lower surfaces of the gauger 6 slide on surfaces of the upper and lower blocks 1 and 2, and consequently, by cutting the molten metal M into the predetermined volume of the gauging portion 7a by rubbing, it can be measured accurately.

Further, the gauging portion 7a filled with this measured molten metal M moves just above the discharge port 5 positioned on the opposite side. And, the molten metal M in the gauging portion 7a is discharged through the discharge port 5 as in the molten state (M1). The discharged molten metal M1 descends in the oil 11 of the fluid tank from the heating zone to the cooling zone. In this descent, the molten metal M1 is cooled by the oil 11 to a temperature less than the melting point, and, in this cooling process, it solidifies into a spherical shape by surface tension, and thereby a minute metallic sphere B of a predetermined size and shape is formed with high accuracy.

By repeating the above operation, the gauging portions 7a and 7b measure molten metals M alternately, and minute metallic spheres B can be obtained continually. Accordingly, minute metallic spheres B can be manufactured with very high accuracy and efficiency.

Next, the first modification of the method and apparatus for manufacturing minute metallic spheres according to this embodiment will be described. The same references are used for substantially the same members as those of the first embodiment.

Figure 4:
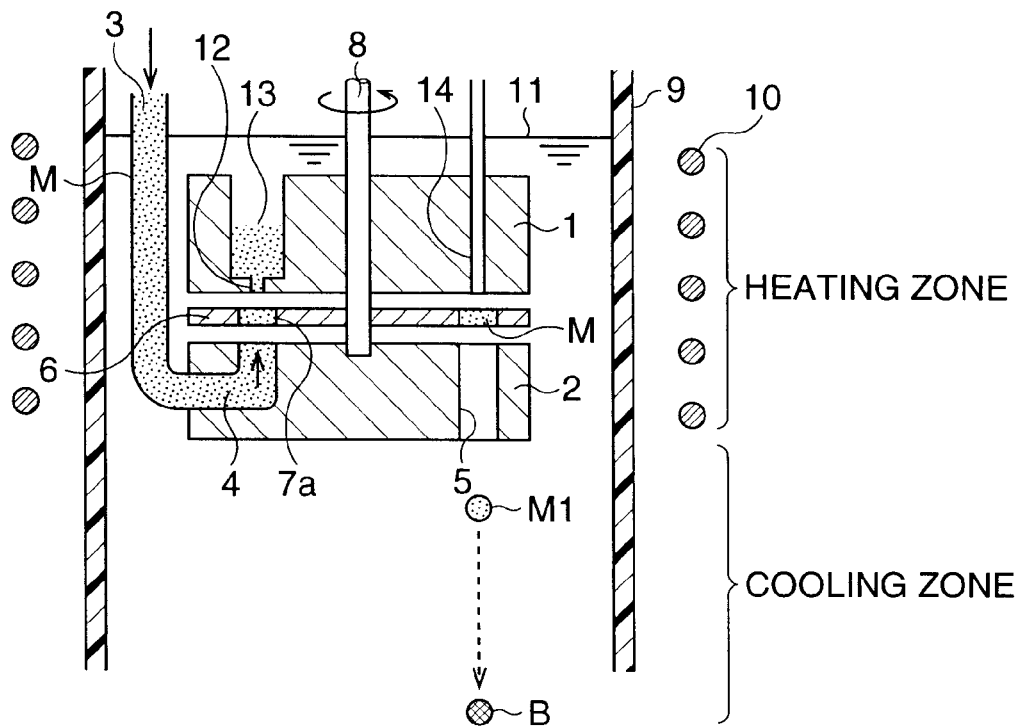
FIG. 4 is a sectional view showing an example of a schematic construction in a modification of the manufacturing apparatus of minute metallic spheres according to the first embodiment of the present invention.

FIG. 4 shows an example of a schematic construction of a manufacturing apparatus of minute metallic spheres according to the first modification of this embodiment. In the drawing, 1 and 2 denote upper and lower blocks for supplying and discharging a molten metal M, 3 denotes a metal throwing-in portion, 4 denotes an injection passage formed in the lower block 2, and 5 denotes a discharge port for the molten metal M formed in the lower block 2. In this example, the injection passage 4 is formed in the lower block 2, and consequently, the molten metal M is supplied from the lower side of a gauger 6.

The upper block 1 is provided with a degassing port 12 so as to correspond to the injection passage 4. This degassing port 12 has a relatively small diameter, and is constricted as shown in the drawing, and made like an orifice. Above the degassing port 12, a storing portion 13 for storing a surplus molten metal M is formed continuously. The upper block 1 is provided also with a gas flow passage 14 so as to correspond to the discharge port 5, and nitrogen gas or the like is to be jetted from this gas flow passage 14 toward the discharge port 5.

In this embodiment, metal thrown in through the metal throwing-in portion 3 becomes the state of the molten metal M in the injection passage 4 by the heating coil 10, like the first embodiment. The molten metal M is injected into the gauging portion 7a positioned just above the injection passage 4 as shown in FIG. 4. When the gauging portion 7a is filled with the molten metal M, then the gauger 6 is driven to rotate by the support shaft 8. At this time, by sliding on surfaces of the upper and lower blocks 1 and 2, the upper and lower surfaces of the gauger 6 can cut the molten metal M into the predetermined volume of the gauging portion 7a by rubbing, to measure it accurately.

Further, the gauging portion 7a filled with this measured molten metal M moves just above the discharge port 5 positioned on the opposite side. And, the molten metal M in the gauging portion 7a is discharged through the discharge port 5 as in the molten state (M1). In this case, particularly in the first modification, nitrogen gas or the like is jetted from the gas flow passage 14 toward the discharge port 5. The molten metal M in the gauging portion 7a is driven in the oil 11 by this gas pressure, and thereby, the molten metal M is prevented from remaining in the gauging portion 7a. Accordingly, an accurate measurement can be guaranteed.

The discharged molten metal M1 descends in the oil 11 of the fluid tank from the heating zone to the cooling zone. In this descent, the molten metal M1 is cooled by the oil 11 to a temperature less than the melting point, and, in this cooling process, it solidifies into a spherical shape by surface tension, and thereby a minute metallic sphere B of a predetermined size and shape is formed with high accuracy.

In case of the above, when the gauging portion 7a from which the molten metal M has been discharged, is again positioned just above the injection passage 4, a molten metal M is injected. In this case, the remainder such as a gas in the gauging portion 7a is completely removed through the degassing port 12. Thereby, unevenness of measurements can be avoided and uniform measurements can be made with high accuracy. Besides, because this degassing port 12 is formed like an orifice, the molten metal M can be injected into the gauging portion 7a in the form of pressurizing and filling. By thus pressurizing and filling, the molten metal M can evenly be injected into the gauging portion 7a, and, also in this point, high measurement accuracy can be ensured.

Here, the second modification of this embodiment will be described.

Figure 5:
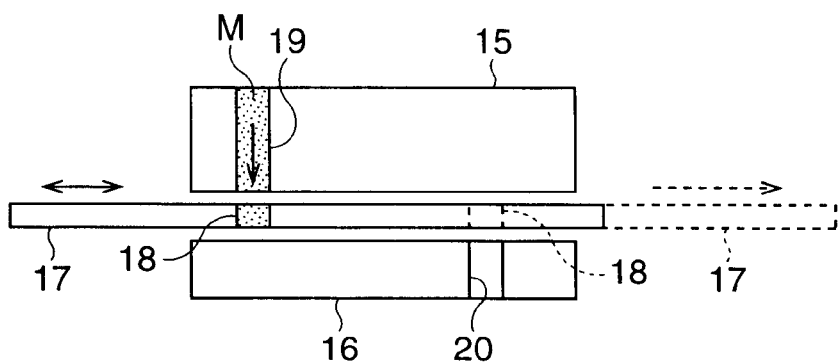
FIG. 5 is a sectional view of a principal part showing another modification of the manufacturing apparatus of minute metallic spheres according to the first embodiment of the present invention.

FIG. 5 shows the construction of a principal part of this second modification. This example has a gauger 17 set between fixed upper and lower blocks 15 and 16 so as to be able to slide (see a both-headed arrow). The gauger 17 is provided with a gauging portion 18. This gauging portion 18 is reciprocated between an injection passage 19 of the upper block 15 and a discharge port 20 of the lower block 16 at predetermined timings following the slide of the gauger 17, for example.

A molten metal M is injected into the gauging portion 18 positioned just below the injection passage 19 as shown in FIG. 5. When the gauging portion 18 is filled with the molten metal M, then the gauger 17 is driven to slide as shown in broken lines. At this time, the upper and lower surfaces of the gauger 17 slide on the surfaces of the upper and lower blocks 15 and 16, and consequently, by cutting the molten metal M into the predetermined volume of the gauging portion 18 by rubbing, it can be measured accurately.

The measured molten metal M is discharged through the discharge port 5 as in the molten state. And, it descends from a heating zone to a cooling zone like the above-described embodiment, for example. In this descent, it is cooled to a temperature less than the melting point. In this cooling process, it solidifies into a spherical shape by surface tension, and, also in this case, a minute metallic sphere of a predetermined size and shape can thereby be obtained with high accuracy.

Also in this case, like the first modification shown in FIG. 4, the injection passage 19 can be formed in the lower block 16. In that case, a degassing port is provided in the upper block 15, and thereby, the same operation and effect as above can be obtained.

As the cooling means for the molten metal M, the example of the fluid tank consisting of the oil 11 was described in the above embodiment, but, other than this, it can be a fluid tank consisting of, e.g., an inert gas such as argon, nitrogen, or helium. Besides, the apparatus of the present invention is not limited to these fluid tanks but it can be used in a vacuum atmosphere.

Next, two examples in which the first embodiment was performed concretely, will be described.

FIRST EXAMPLE

First, the first example will be described. This example is an example of manufacturing metallic spheres having the diameter of 300 μm, and corresponds to the first embodiment or the first modification.

The upper portion of a vessel 9 of a cylindrical tube filled with a vegetable oil as an oil 11 is heated to 220 to 270° C. by a heating coil 10. In this heating zone, a gauger 6 made of a metallic disk having the diameter of 150 mm and the thickness of 1 mm is disposed. In the gauger 6, gauging portions 7 made of through holes having the diameter of 0.14 mm and formed on the circumference of the diameter of 120 mm at pitch intervals of 10 mm, are provided. The gauger 6 is set between upper and lower blocks 1 and 2, and a molten metal M is supplied and discharged in relation to the gauging portions 7 through an injection passage 4 and a discharge port 5.

TABLE 1

| NO | metal composition (%) | heating zone temperature (° C.) | yield of metallic spheres of diameter of 280 to 310 μm (%) |
|---|---|---|---|
| 1 | 95Sn-5Pb | 240 | 75 |
| 2 | 60Sn-40Pb | 220 | 68 |
| 3 | Sn-3.5Ag-0.7Cu | 260 | 77 |

Table 1 shows results of manufacturing metallic spheres in the first examples. Clearly from the Table 1, in case of the alloy of any metal composition, metallic spheres having aimed diameters could be manufactured at a high yield. As shown in this example, according to the present invention, high manufacturing efficiency can be obtained. It may be said in this connection that the yield of a conventional atomization method is in the degree of 10 to 30% at most.

SECOND EXAMPLE

The second example is an example of manufacturing metallic spheres having the diameter of 300 μm, and corresponds to the first embodiment or the first modification.

A vessel 9 of a cylindrical tube is made into a fluid tank from the lower portion of which helium gas is made to flow in, and the upper portion of the vessel 9 is heated to 360 to 450° C. by a heating coil 10. In this heating zone, a gauger 6 made of a metallic disk having the diameter of 150 mm and the thickness of 1 mm is disposed. In the gauger 6, gauging portions 7 made of through holes having the diameter of 0.14 mm and formed on the circumference of the diameter of 120 mm at pitch intervals of 10 mm, are provided. The gauger 6 is set between upper and lower blocks 1 and 2, and a molten metal M is supplied and discharged in relation to the gauging portions 7 through an injection passage 4 and a discharge port 5.

TABLE 2

| NO | metal composition (%) | heating zone temperature (° C.) | yield of metallic spheres of diameter of 280 to 310 μm (%) |
|---|---|---|---|
| 1 | 1.5Sn-96.0Pb-2.5Ag | 350 | 72 |
| 2 | 1.0Sn-97.5Pb-1.5Ag | 380 | 79 |
| 3 | 83.0Sn-7.0Pb-10.0Ag | 450 | 69 |

Table 2 shows results of manufacturing metallic spheres in the second example. Clearly from the Table 2, in case of the alloy of any metal composition, metallic spheres having aimed diameters could be manufactured at a high yield.

Although the example in which the present invention applied to cases of manufacturing metallic spheres have been described in the above embodiments, the present invention is not limited to metallic spheres and can apply to cases of manufacturing minute spheres of glass, plastic, or the like, in the same manner, and, in any case, minute spheres can be manufactured with high accuracy and efficiency.

Second Embodiment

Hereinafter, a preferred embodiment of method and apparatus for manufacturing minute metallic spheres according to the second embodiment will be described on the basis of drawings.

Here, first, a minute metallic sphere in the embodiment is an example made of, e.g., solder in particular. In manufacturing process of a semiconductor device, in order to connect an electrode portion of a semiconductor element and an external circuit or the like, both are joined through a bump made of a minute metallic sphere. This minute metallic sphere suitable for the bump is an object, and, in particular, one having a diameter size of hundreds μm or less is obtained.

Figure 6:
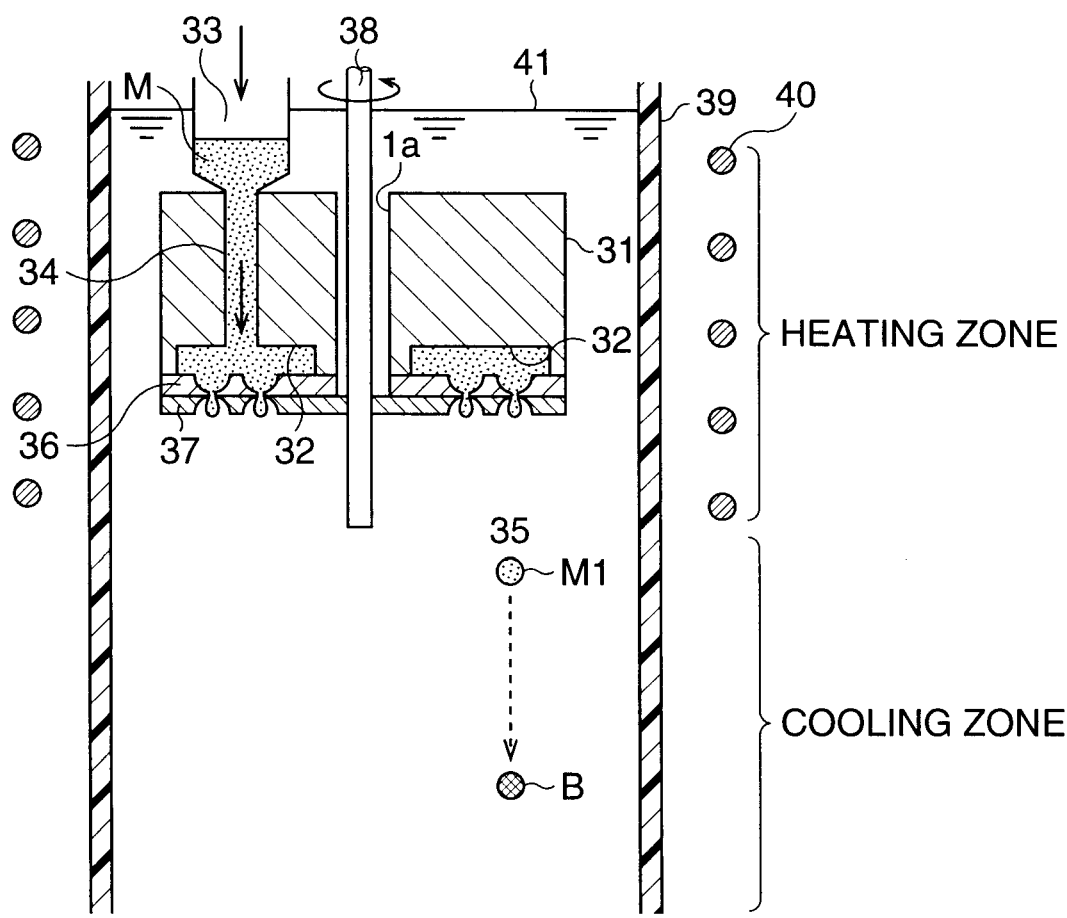
FIG. 6 is a sectional view showing an example of a schematic construction of a manufacturing apparatus of minute metallic spheres according to the second embodiment of the present invention.

FIG. 6 shows an example of a schematic construction of a manufacturing apparatus of minute metallic spheres used in a method of the present invention. In FIG. 6, 31 denotes an upper block for supplying and discharging a molten metal M, 33 denotes a metal throwing-in portion, and 34 denotes an injection passage formed in the upper block 31. Besides, a through hole 31a is formed at the center of the upper block 1, and a rotational shaft 38 is inserted.

Figure 7:
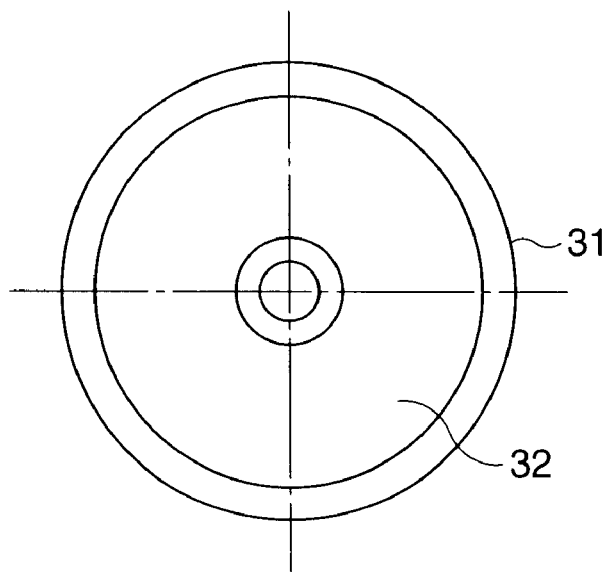
FIG. 7 is a plan view showing an upper block of the manufacturing apparatus of minute metallic spheres according to the second embodiment of the present invention.

The injection passage 34 is connected to an injection chamber 32. FIG. 7 shows a plan view of the upper block 31 from below. Thus, the injection chamber 32 is formed on the lower surface of the upper block 31 in a recess shape, and around the through hole 31a in a ring shape. The upper block 31 is suitably made of a material such as a metal, a resin, or a ceramic, that is not wetted with solder. Or, a coating such as Teflon may be made on the surfaces of ones made of those materials, and further it is preferable to have a thermal resistance and not to deform with heat.

To the lower surface of the upper block 31, a stationary plate 36 in which holes for discharging a molten metal M are formed is fixed. A rotational plate 7 is disposed in close contact with the stationary plate 36. The rotational plate 7 is fixed to the rotational shaft 38 and can rotate together with the rotational shaft 8. The stationary and rotational plates 36 and 37 are preferably made of a material having the same properties as that of the upper block.

In this example, like the upper block 31, the stationary and rotational plates 36 and 37 are, e.g., circular.

The upper block 31 and parts attendant upon them are accommodated in a vessel (made of glass or the like) 39 in a united form, as shown in FIG. 6. Around the vessel 39, a heating coil 40 is provided as a heating means for heating and melting a metal to form a metallic sphere. Besides, the interior of the vessel 39 is formed as a fluid tank. In this example, an oil 41 is stored as a cooling means for cooling the molten metal M discharged through the holes 36a of the stationary plate 36, to a temperature less than the melting point.

The heating coil 40 may be, e.g., an electric heating wire coil or a high-frequency coil or the like, and heats the metal thrown in through the metal throwing-in portion 33 and keeps it in the state of the molten metal M. The corresponding portion in the vessel 39 to the heating coil 40 is thus set into a heating zone or region. Besides, a portion in the vessel 39 distant downward from the heating coil 40 is set into a cooling zone or region. By thus providing the heating and cooling zones vertically, a temperature inclination is formed in the vessel 39.

In the above construction, the metal thrown in through the metal throwing-in portion 33 becomes the state of the molten metal M in the injection passage 34 by the heating coil 40. The molten metal M is injected into the injection chamber 32 positioned just below the injection passage 34 as shown in FIG. 6. When the molten metal M is injected in the injection chamber 32, then the rotational plate 7 is driven to rotate by the rotational shaft 38.

Figure 8:
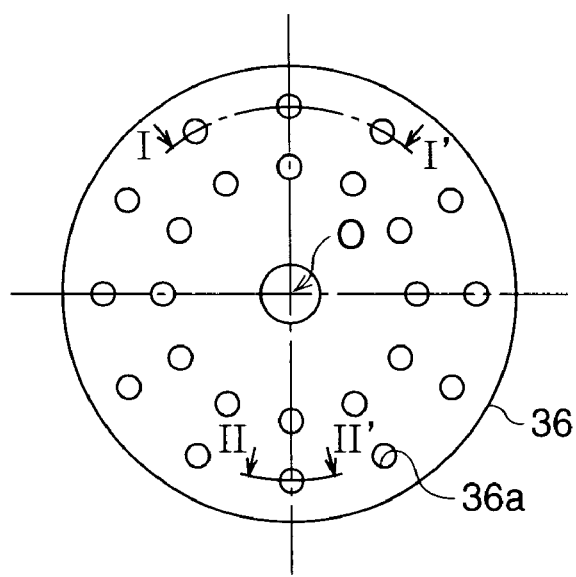
FIG. 8 is a plan view showing a stationary plate of the manufacturing apparatus of minute metallic spheres according to the second embodiment of the present invention.

FIG. 8 shows a plan view viewing the stationary plate 36 from the lower part of FIG. 6. In the stationary plate 36, holes 36a through which a molten metal M is discharged are formed at each predetermined angle (30 degrees) in two lines concentric around a point O.

Figure 9:
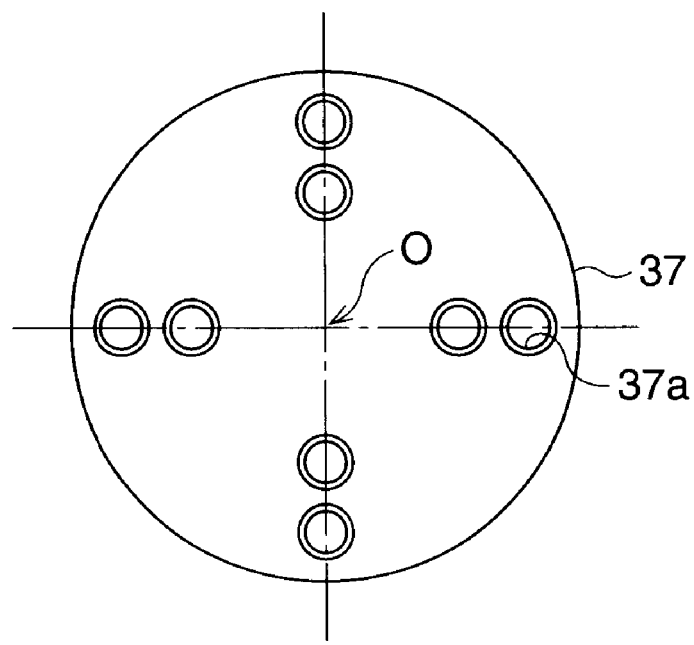
FIG. 9 is a plan view showing a rotational plate of the manufacturing apparatus of minute metallic spheres according to the second embodiment of the present invention.

FIG. 9 shows a plan view viewing the rotational plate 37 from the lower part of FIG. 6. In the rotational plate 7, holes 37a for cutting the molten metal M discharged through the holes 36a of the stationary plate 36, at each predetermined time, are formed at each predetermined angle (90 degrees) in two lines concentric around a point O to correspond to the radii on which the holes 36a are formed. The angular positions at which the holes 36a and 37a are formed around the point O are not limited to the above-described angles. Besides, the holes 36a and 37a may not be formed concentrically.

Figure 10:
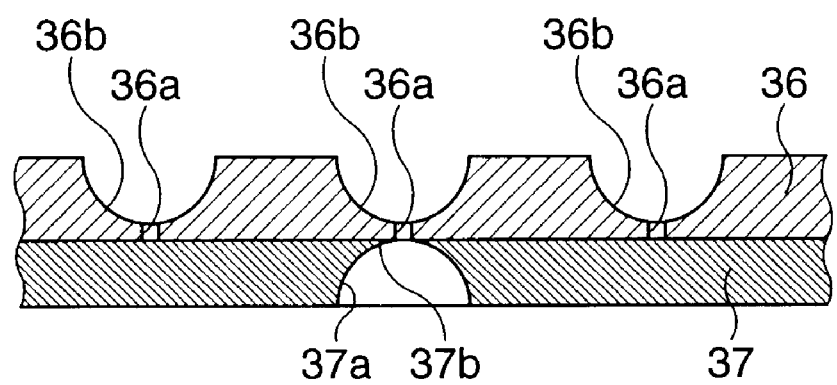
FIG. 10 is a schematic sectional view showing a principal part of the manufacturing apparatus of minute metallic spheres according to the second embodiment of the present invention.

FIG. 10 shows a section of the stationary and rotational plates 36 and 37. Here, FIG. 10 shows a section along an circular arc I–I' shown in FIG. 8. As shown in this sectional view, a recessed portion 36b is formed around each hole 36a in the upper surface of the stationary plate 36. Besides, each hole 37a of the rotational plate 37 is so formed as to have a curved surface in section, and an edge 37b is formed at the upper end. A section of the hole 37a may be so formed as to have a slanting surface like a taper. Besides, the sectional shape of the recessed portion 36b may also be formed like a taper.

Because the rotational plate 37 is fixed to the rotational shaft 38, the rotational plate 7 is rotated relatively to the stationary plate 36 by rotating the rotational shaft 38. Here, when the rotational plate 37 is rotated at a constant angular velocity, a hole 37a of the rotational plate 7 and a hole 36a of the stationary plate 36 are overlapped at a constant period.

Figure 11A:
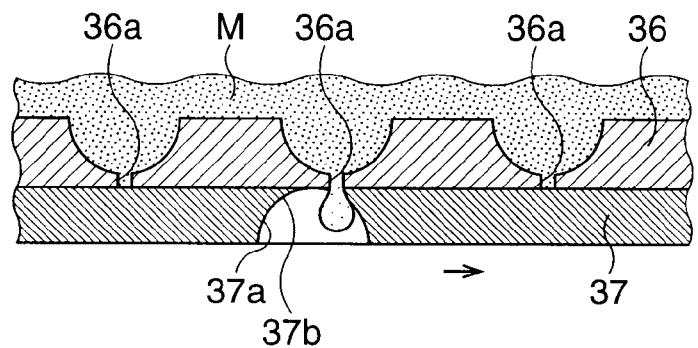
FIGS. 11A to 11C are schematic sectional views showing steps of manufacturing minute metallic spheres according to the second embodiment of the present invention, in order of the steps.
Figure 11B:
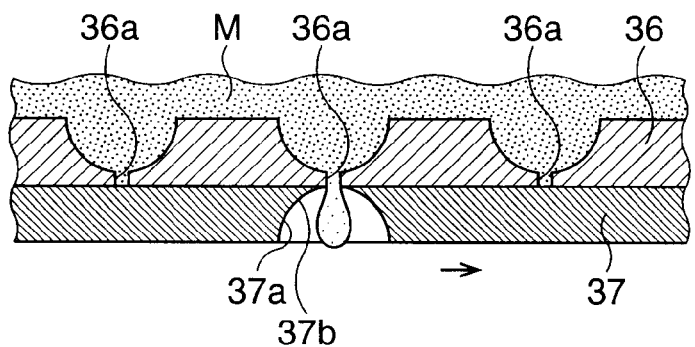
Figure 11C:
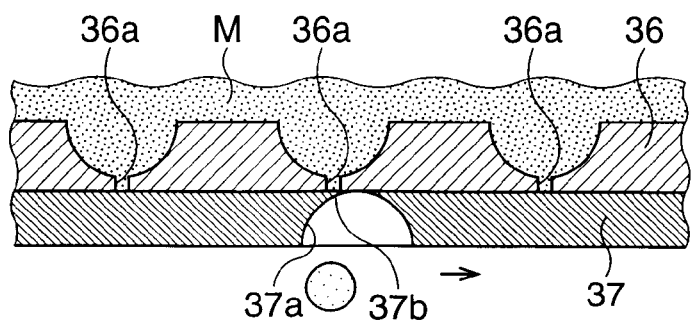

FIGS. 11A to 11C are sectional views showing, in a time series, a state that the rotational plate 37 is rotated to cut a molten metal M by the rotational plate 36. Like FIG. 10, FIGS. 11A to 11C also show the section along the circular arc I–I' shown in FIG. 8.

In FIGS. 11A to 11C, the rotational plate 37 moves to the right side relatively to the stationary plate 36. First, as shown in FIG. 11A, when a hole 37a of the rotational plate 7 comes to the position of a hole 36a of the stationary plate 36, and the positions of both are overlapped, a molten metal M starts to be discharged through the hole 36a of the stationary plate 36.

And, as shown in FIG. 11B, while the hole 37a of the rotational plate 37 is overlapping the hole 36a of the stationary plate 36, the molten metal M is discharged to hang down from the hole 36a.

Further, when the rotational plate 37 is rotated, the molten metal M hanging down from the hole 36a is cut with the edge 37b of the rotational plate 37. And, the cut molten metal M falls in the oil 41.

As shown in FIG. 6, the molten metal M having fallen in the oil 41, descends from the heating zone to the cooling zone in the oil 41 of the liquid tank. In this descent, the molten metal M is cooled by the oil 41 to a temperature less than the melting point, and, in this cooling process, it solidifies into a spherical shape by surface tension, and thereby, a minute metallic sphere B of a predetermined size and shape is formed with high accuracy.

Because both the holes 37a of the rotational plate 37 and the holes 36a of the stationary plate 36 are formed at each constant angle around the point O, if the rotational plate 37 is rotated at a constant speed, the period at which a hole 37a overlaps an arbitrary hole 36a becomes always constant. Consequently, by making the pressure applied to the molten metal M on the stationary plate 36 always constant, the sizes of the formed minute metallic spheres B can be uniform. Accordingly, the minute metallic spheres B can be manufactured with very high accuracy and efficiency.

Figure 12:
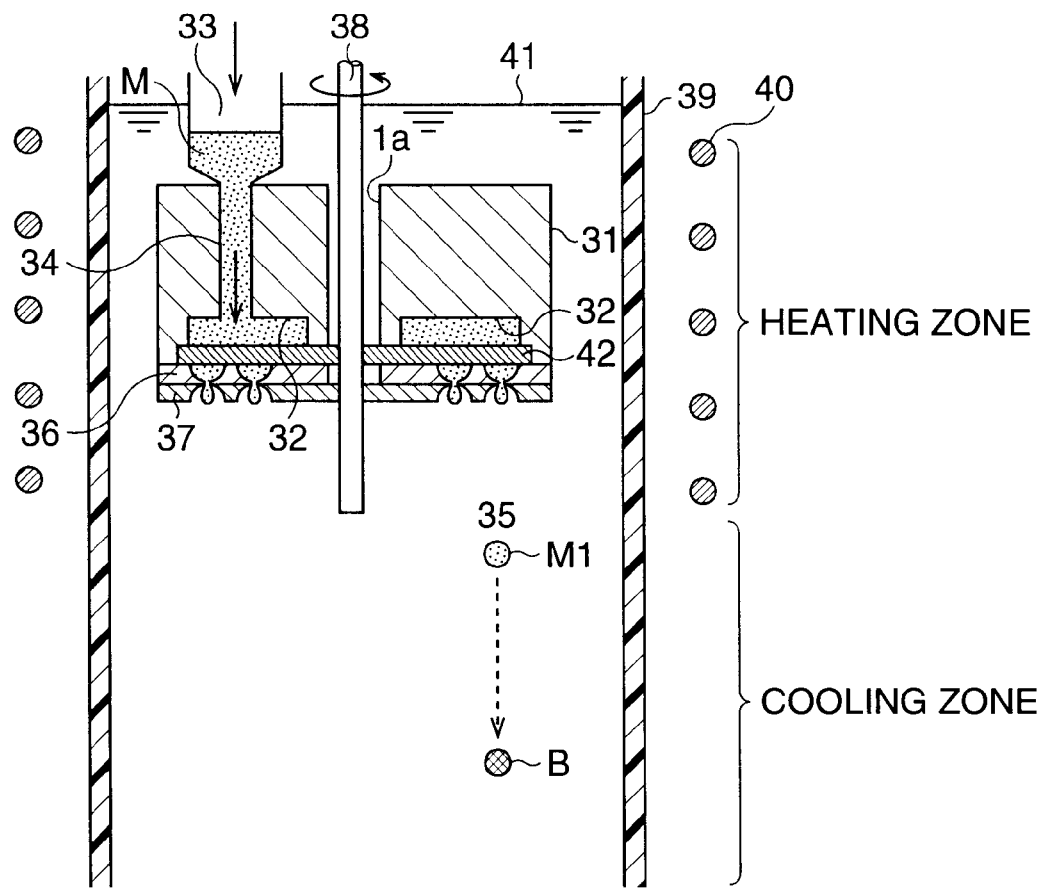
FIG. 12 is a sectional view showing an example of a schematic construction of a manufacturing apparatus of minute metallic spheres according to a modification of the second embodiment of the present invention.

Next, the first modification of the manufacturing method of minute metallic spheres according to the second embodiment will be described. FIG. 12 shows an example of a schematic construction of a manufacturing apparatus of minute metallic spheres used in the first modification of this embodiment. The manufacturing apparatus of minute metallic spheres according to the first modification differs from the second embodiment in the point that a second rotational plate 42 is provided on the stationary plate 36. In FIG. 12, the same components as those of the second embodiment are denoted by the same references.

In the manufacturing apparatus according to the first modification, the injection chamber 32 of the upper block 1 is formed over the second rotational plate 42. And, the molten metal M is temporarily isolated from the stationary plate by the second rotational plate 42. The second rotational plate 42 is also fixed to the rotational shaft 38, and, by rotating the rotational shaft 38, the rotational plate 37 and the second rotational plate 42 are rotated as one body. The constructions other than this, that is, the shape of the stationary plate 36, the shape of the rotational plate 37, etc., are the same as those of the first embodiment.

Figure 13:
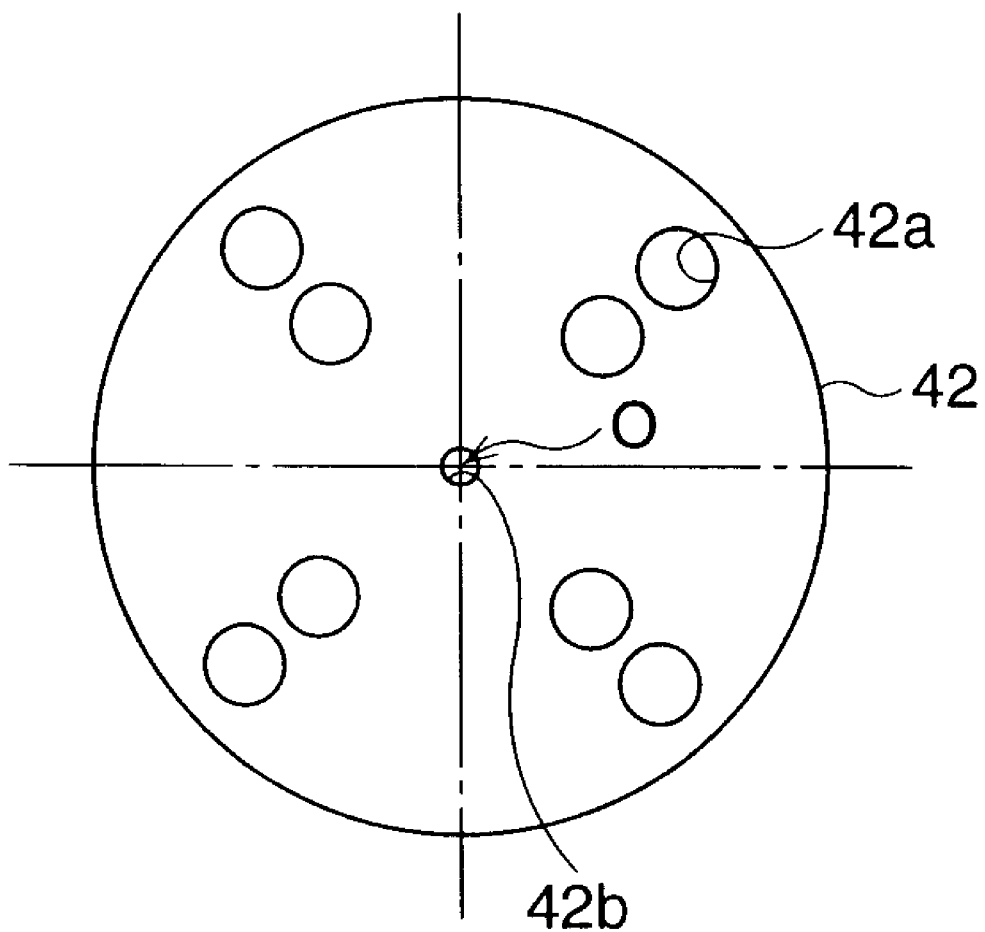
FIG. 13 is a plan view showing a second rotational plate of the manufacturing apparatus of minute metallic spheres according to the modification of the second embodiment of the present invention.

FIG. 13 shows a plan view of the second rotational plate 42 from the lower part of FIG. 12. Thus, a plurality of holes 42a is formed at each predetermined angle around the point O in the second rotational plate 42. And, the radial positions of holes 42a are formed in two lines so as to correspond to the radial positions of the holes 36a. A hole 42b is a hole for inserting/fixing the rotational shaft 8.

FIGS. 14A to 14D are sectional views showing, in a time series, a state that the rotational plate 37 and the second rotational plate 42 are rotated to cut a molten metal M by rubbing on the stationary plate 36 and measure it by the second rotational plate 42, and cut it by the rotational plate 36. FIGS. 14A to 14D shows the section along a circular arc II–II' shown in FIG. 8, in which showing the neighboring hole 36a in the drawings is omitted.

Figure 14A:
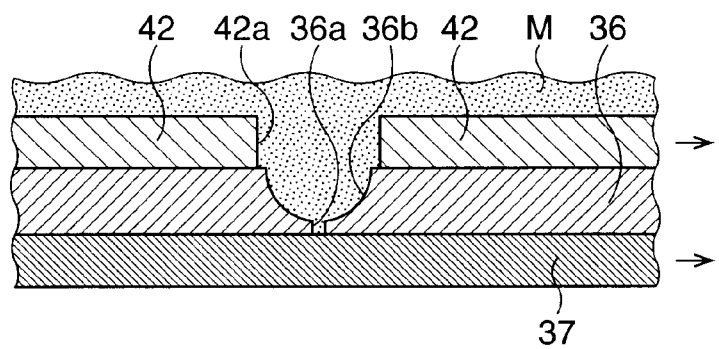
FIGS. 14A to 14D are schematic sectional views showing steps of manufacturing minute metallic spheres according to modification of the second embodiment of the present invention, in order of the steps.

In FIGS. 14A to 14D, the rotational plate 37 and the second rotational plate 42 move to the right side relatively to the stationary plate 36. First, as shown in FIG. 14A, when a hole 42a of the second rotational plate 42 comes to the position of a hole 36a of the stationary plate 36, and the positions of both are overlapped, a molten metal M is poured in the hole 36a of the stationary plate 36. As described above, because the position of any hole 37a of the rotational plate 37 does not overlap the position of the hole 42a of the second rotational plate 42, the molten metal M is not discharged downward beyond the hole 36a in this state.

Figure 14B:
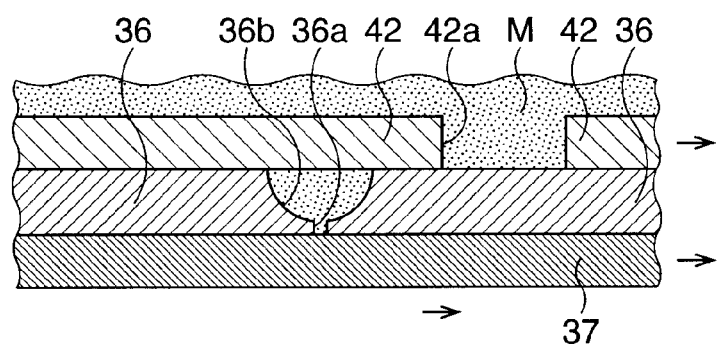

And, when the rotational plate 37 and the second rotational plate 42 are rotated relatively to the stationary plate 36 as shown in FIG. 14B, because the position of the hole 42a of the second rotational plate 42 is first shifted in relation to the hole 36a, the molten metal M stored in the recessed portion 36b is cut by rubbing so that a predetermined quantity of molten metal M remains in the recessed portion 36b. Thereby, the molten metal M to make a minute metallic sphere is measured. Here, the volume of the recessed portion 36b is so designed as to make the measured molten metal M possible to fall by its own weight.

Figure 14C:
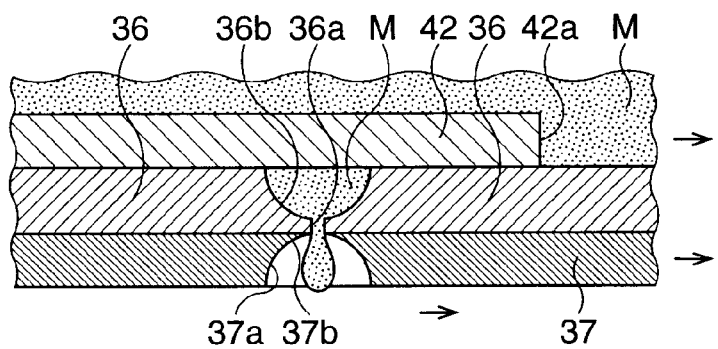

And, as shown in FIG. 14C, the hole 37a of the rotational plate 37 overlaps the hole 36a of the stationary plate 36. In this, the molten metal M stored in the recessed portion 37b is discharged to hang down from the hole 36a.

Figure 14D:
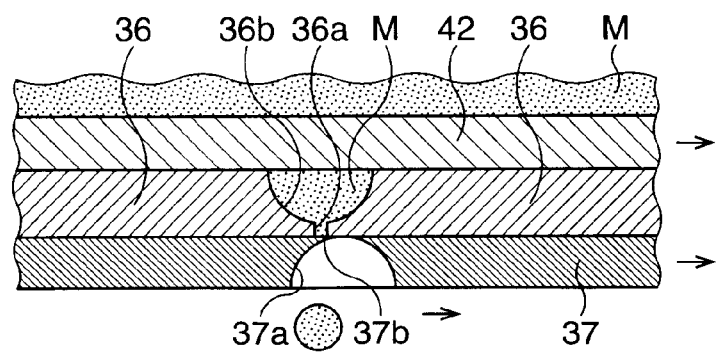

Further, when the rotational plate 37 is rotated, the molten metal M hanging down from the hole 36a is cut with the edge 37b of the rotational plate 37, as shown in FIG. 14D. And, the cut molten metal M falls in the oil 41.

After this, a minute metallic sphere B is formed like the second embodiment.

According to the first embodiment described above, because a predetermined quantity of molten metal M can be measured by the second rotational plate 42, a minute metallic sphere B of a predetermined size and shape can be formed with high accuracy.

Next, the second modification of the second embodiment will be described. In the second embodiment and the first modification, the method of forming minute metallic spheres by cutting a molten metal M discharged by its own weight, at each predetermined time, has been described. The second modification differs from the second embodiment or the first modification in the point that a predetermined pressure is applied to the molten metal, and the molten metal M discharged by this pressure is cut at each predetermined time.

Figure 15:
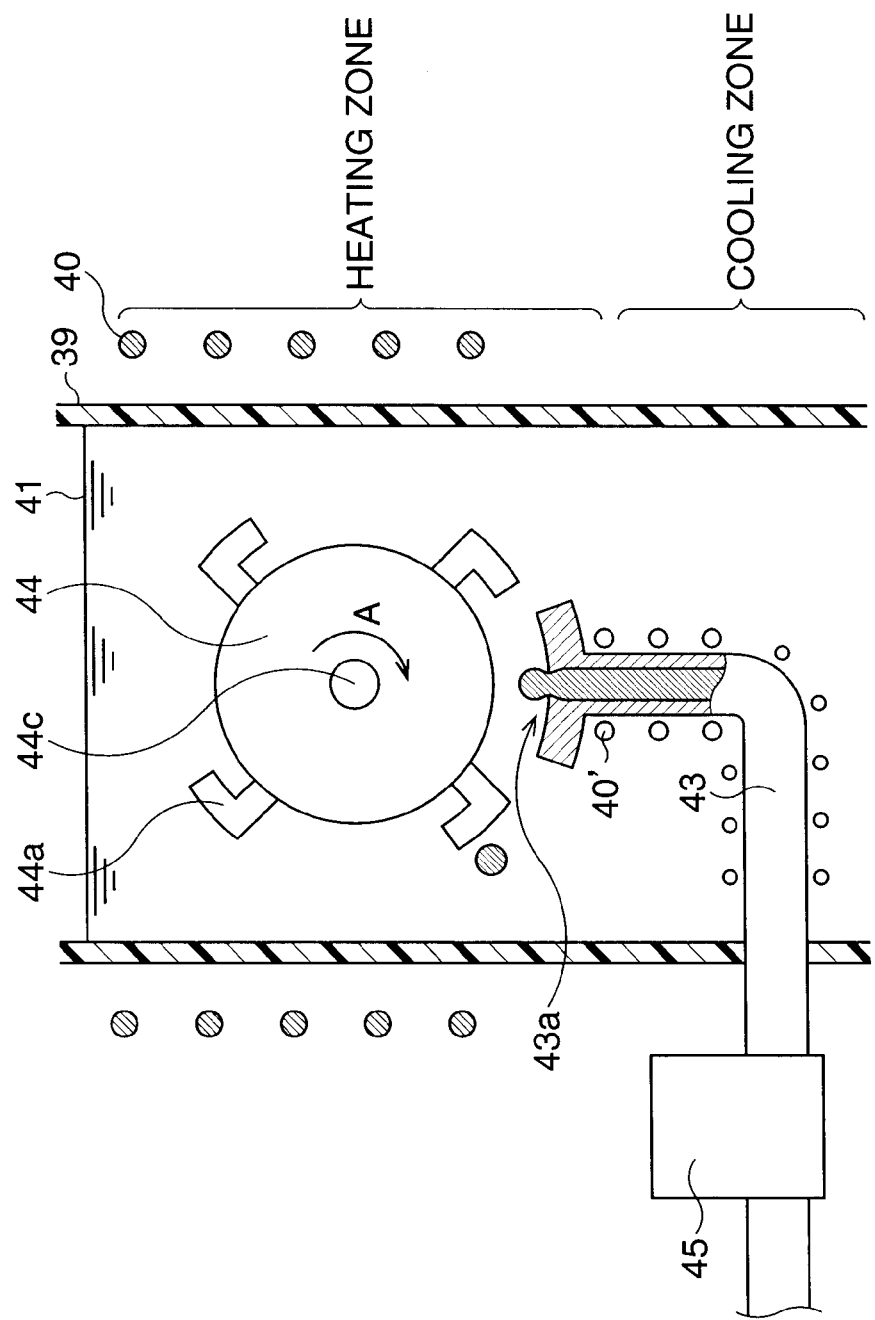
FIG. 15 is a sectional view showing an example of a schematic construction of a manufacturing apparatus of minute metallic spheres according to another modification of the second embodiment of the present invention.

FIG. 15 shows an example of a schematic construction of a manufacturing apparatus of minute metallic spheres according to the second modification. In FIG. 15, a metal discharge pipe 43 and a rotational blade 44 are disposed in a vessel 39. Like the first embodiment, around the vessel 39, a heating coil 40 is disposed as a heating means for heating and melting a metal to form metallic spheres. Besides, the interior of the vessel 39 is formed as a fluid tank. In this example, an oil 41 is stored as a cooling means for cooling the molten metal M discharged from a hole 36a of a rotational plate 36 to a temperature less than the melting point.

The heating coil 40 may be, e.g., an electric heating wire coil or a high-frequency coil or the like, and heats metal thrown in through a metal throwing-in portion 33 and keeps it in the state of the molten metal M. The corresponding portion in the vessel 39 to the heating coil 40 is thus set into a heating zone or region. Besides, a portion in the vessel 39 distant downward from the heating coil 40 is set into a cooling zone or region. By thus providing the heating and cooling zones vertically, a temperature inclination is formed in the vessel 39.

Besides, a heating coil 40' is wound also around the metal discharge pipe 43 in the oil 41. Here, the heating coil 40' effects the function of making the molten metal M in the metal discharge pipe 43 into a molten state, but it is so constructed as to give the cooling zone no heat. By a method not using the heating coil 40', the molten metal M in the metal discharge pipe 43 may be made into a molten state so as to give the oil 41 in the cooling zone no heat.

The metal discharge pipe 43 is connected to a pressurizer 45 outside the vessel 39. The pressurizer 45 performs its duties of applying a predetermined pressure to the molten metal M in the metal discharge pipe 43, and discharging the molten metal M at a constant rate through a metal discharge port 43a at the front end of the metal discharge pipe 43.

The rotational blade 44 can be rotated around a shaft 44c in the direction of an arrow B at a constant speed. Four blades 44a are provided on the outer circumference of the rotational blade 44.

Figure 16:
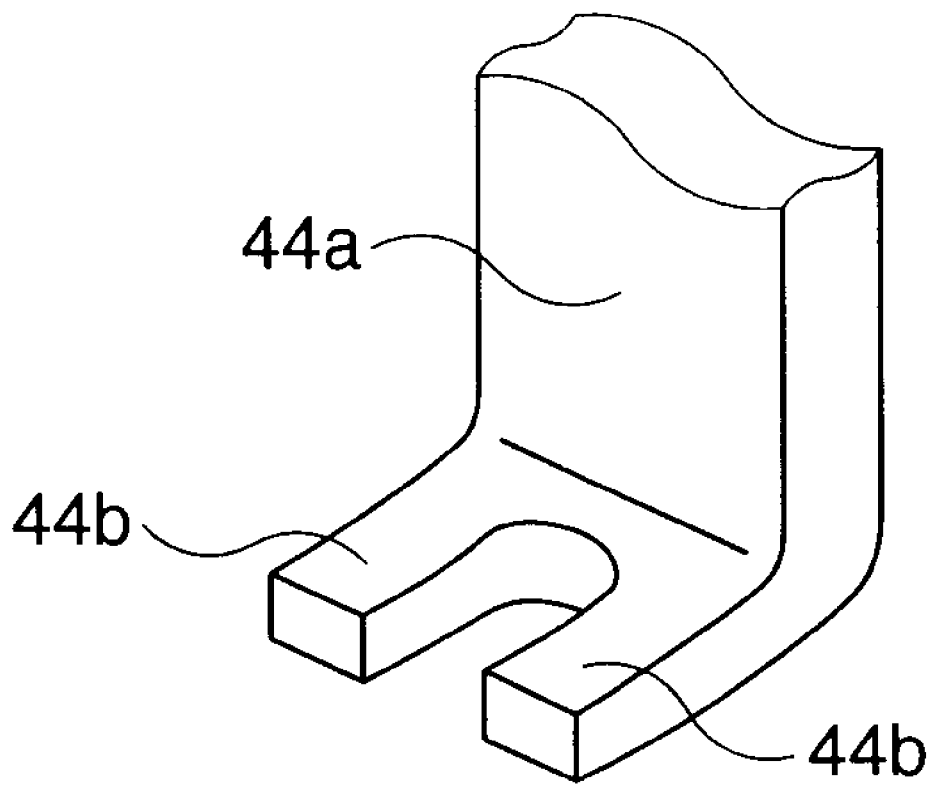
FIG. 16 is a sectional view showing a principal part of the manufacturing apparatus of minute metallic spheres according to the other modification of the second embodiment of the present invention.

FIG. 16 is a perspective view showing the shape of each blade 44a. The front end of the blade 44a is bent at 90 degrees, and provided with a cutter 44b having a U-shaped recessed shape. The recessed shape of the cutter 44b corresponds to the position of the metal discharge port 43a.

Next, a method of manufacturing minute metallic spheres using the manufacturing apparatus of minute metallic spheres according to the second modification.

First, a predetermined pressure is applied to the molten metal M in the metal discharge pipe 43 by the pressurizer 45. Thereby, the molten metal M is discharged through the metal discharge port 43a at a constant rate. But, here, the molten metal M merely protrudes beyond the metal discharge port 43a by a predetermined quantity, and does not separate from the metal discharge port 43a.

And, the rotational blade 44 is rotated at a constant speed. Thereby, the cutter 44b having the U-shaped recessed shape, of a blade 44a cuts the molten metal M protruding beyond the metal discharge port 43a, and the cut molten metal M falls in the oil 41.

After this, a minute metallic sphere B is formed like the first embodiment.

According to the modification 2 of the second embodiment described above, by applying a predetermined pressure to the molten metal M, the discharge direction of the molten metal M can be a direction other than the downward direction. Accordingly, for example, it may be constructed to discharge laterally in the vessel 39 and cut.

Besides, by changing the pressure applied from the pressurizer 45 to the molten metal M, the discharge quantity of the molten metal M can be changed, and, by making the number of rotations of the rotational blade 44 correspond to this, it is possible to control freely the sphere diameter and the manufactured number per unit time.

Third Embodiment

Hereinafter, a preferred embodiment of method and apparatus for manufacturing minute metallic spheres according to the third embodiment of the present invention will be described on the basis of drawings.

Here, first, a minute metallic sphere in this embodiment is an example made of, e.g., solder in particular. In manufacturing process of a semiconductor device, in order to connect an electrode portion of a semiconductor element and an external circuit or the like, both are joined through a bump made of a minute metallic sphere. This minute metallic sphere suitable for the bump is an object, and, in particular, one having a diameter size of hundreds $\mu$m or less is obtained.

Figure 17:
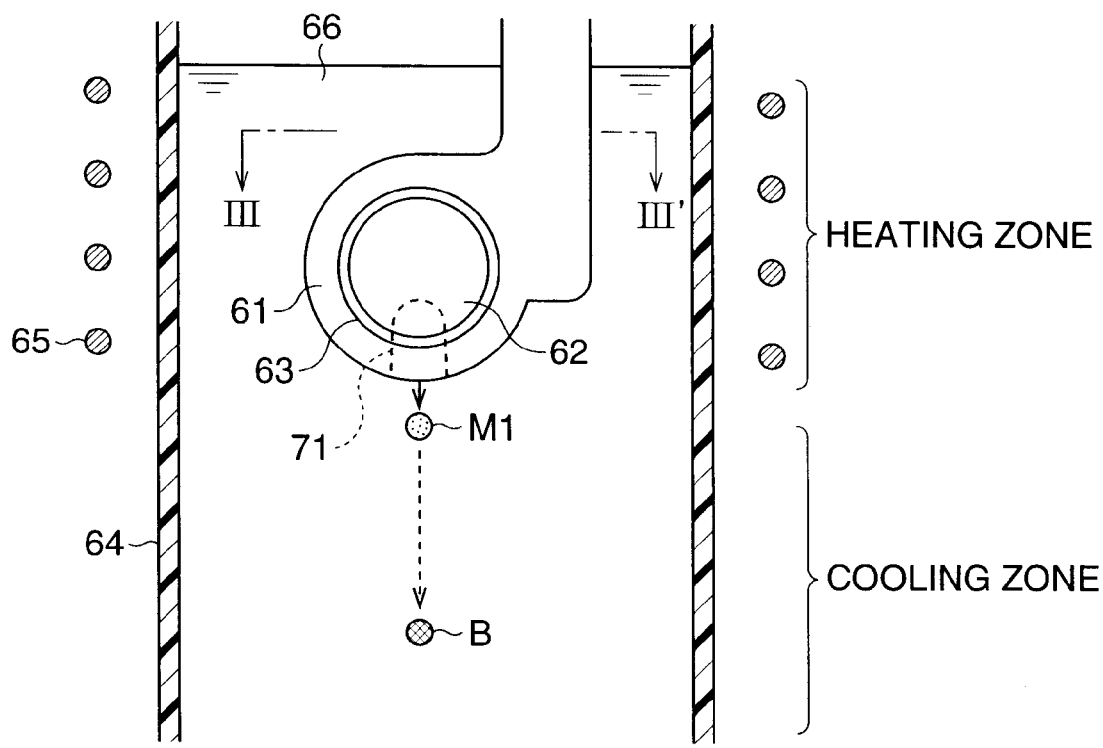
FIG. 17 is a sectional view showing an example of a schematic whole construction of a manufacturing apparatus of minute metallic spheres according to the third embodiment of the present invention.

FIG. 17 shows an example of a schematic construction of a manufacturing apparatus of minute metallic spheres used in a method of the present invention. In the drawing, 61 and 62 denote outer and inner blocks for supplying and discharging a molten metal M, and 63 denotes a rotational drum as a measurement means set between the outer and inner blocks 61 and 62 constituting a metal supply means, so as to be able to slide and rotate.

The outer and inner blocks 61 and 62 and parts attendant upon them are accommodated in a vessel (made of glass or the like) 64 in a united form, as shown in FIG. 17. Around the vessel 64, a heating coil 65 is provided as a heating means for heating and melting a metal to form a metallic sphere. Besides, the interior of the vessel 64 is formed as a fluid tank. In this example, an oil 66 is stored as a cooling means for cooling the molten metal M discharged from the rotational drum 63, to a temperature less than the melting point.

Here, the outer and inner blocks 61 and 62 are generally cylindrical or columnar (see FIG. 18), and fixed to predetermined positions of the apparatus. These blocks 61 and 62 are suitably made of a material such as a metal, a resin, or a ceramic, that is not wetted with solder. Or, a coating such as Teflon may be made on the surfaces of ones made of those materials, and further it is preferable to have a thermal resistance and not to deform with heat.

Besides, the rotational drum 63 is suitably made of a material such as a metal, a resin, or a ceramic, that is not wetted with solder, into a cylindrical shape. Further, in the rotational drum 63, a coating such as Teflon may be made on the surfaces of ones made of those materials, and further it is preferable to have a thermal resistance and not to deform with heat. As for the material for making the rotational drum 63, or the like, may be the same as that for the outer and inner blocks 61 and 62, but it is not always necessary to made of the same material. When the rotational drum 63 is set between the outer and inner blocks 61 and 62, it is set closely without inside and outside spaces and to be rotatable.

Figure 18:
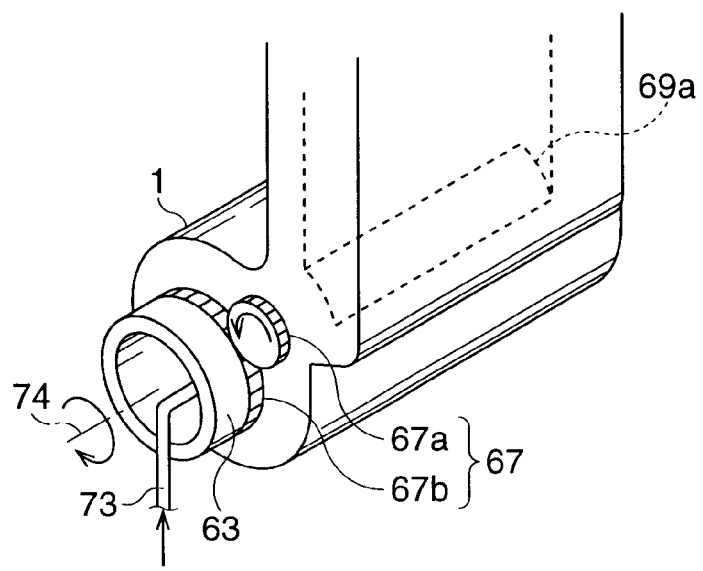
FIG. 18 is a perspective view of a principal part of the manufacturing apparatus of minute metallic spheres according to the third embodiment of the present invention.

The rotational drum 63 is driven and rotated by a drive mechanism 67, as shown in FIG. 18, for example. The drive mechanism 67 may include a gear sequence such as gears 67a and 67b or the like as the example shown in the drawing, and it is constructed to drive from the outside. This drive mechanism 67 can control and regulate the rotational direction, rotational speed, timing, or the like, of the rotational drum 63.

Figure 19:
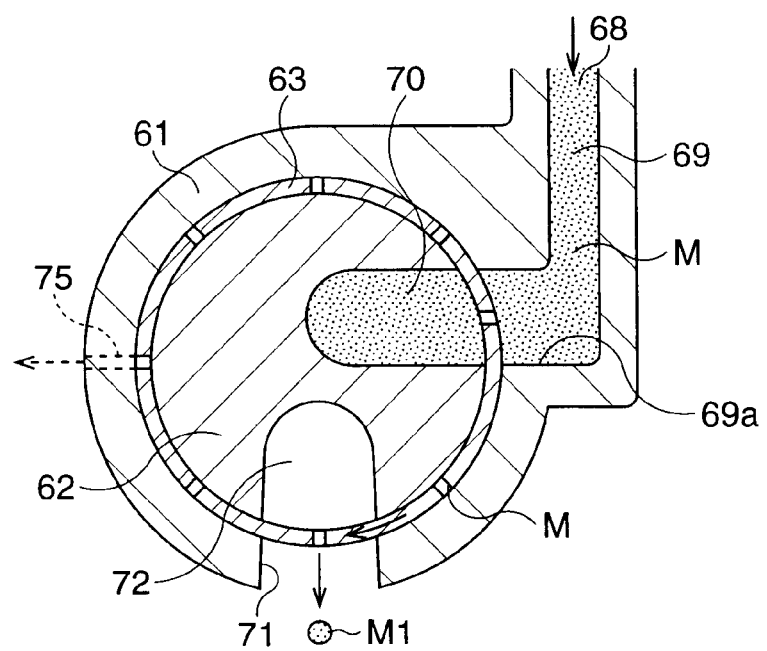
FIG. 19 is a sectional view taken along line III–III' of FIG. 17, showing an example of the construction of a principal part of the manufacturing apparatus of minute metallic spheres according to the third embodiment of the present invention.

Next, FIG. 19 shows an example of the construction of a principal part of an apparatus of the present invention. In the drawing, 68 denotes a metal throwing-in portion provided in the outer block 61, and 69 denotes an injection passage formed in the outer block 61. The inner circumferential surface of the outer block 61 is formed into a cylindrical shape on which the rotational drum 63 slides, and, in part of it, an injection port 69a (see FIG. 18) as an open end of the injection passage 69 is opened. Besides, the inner block 62 is provided with a storage portion 70 disposed oppositely to the injection passage 69.

A molten metal M is pressurized and supplied to the metal throwing-in portion 68 from a not-shown supply source, and a surplus molten metal M is stored in the storage portion 70. In this case, the pressure P1 of the molten metal M pressurized and supplied to the injection passage 69 and the pressure P2 in the storage portion 70 are set such that P1>P2.

In the lower portion of the outer block 61, a discharge port 71 through which a molten metal M1 after measurement is discharged into the oil 66 as described later, is opened. Besides, in the inner block 62, a gas chamber 72 for discharging the molten metal M from the rotational drum 63, is so disposed as to correspond to the discharge port 71 to sandwich the rotational drum 63. As shown in FIG. 18, a gas supply pipe 73 is connected to the gas chamber 72, and an inert gas such as helium gas is pressurized and supplied.

Figure 20:
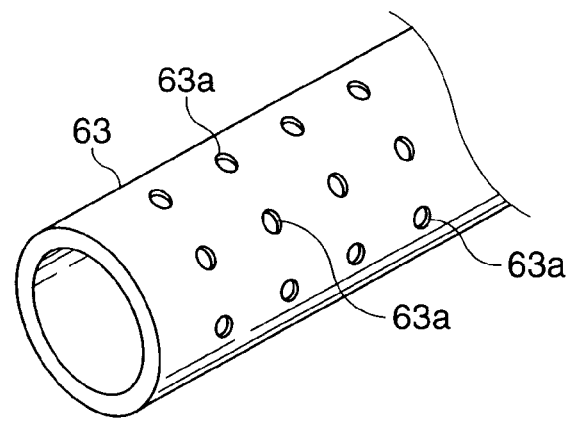
FIG. 20 is a partial perspective view showing a rotational drum according to the third embodiment of the present invention.

The rotational drum 63 as a measurement means has gauging portions 63a in which the molten metal M is injected, as shown in FIG. 20, for example. The gauging portions 63a are made of a plurality of through holes of the same size, and each through hole is precisely formed so as to have the same predetermined volume by the wall thickness of the rotational drum 63 and its hole diameter. As the example of FIG. 20, a plurality of lines of through holes along a longitudinal direction of the rotational drum 63 can be provided. Although the rotational drum 63 is driven and rotated by the drive mechanism 67 around the rotational shaft 74 as described above, it is disposed to correspond to the injection port 69a of the injection passage 69 at a predetermined timing.

In case of the above, the heating coil 65 may be, e.g., a high-frequency coil or the like, and heats metal thrown in through the metal throwing-in portion 68 and keeps it in the state of the molten metal M. The corresponding portion in the vessel 64 to the heating coil 65 is thus set into a heating zone or region. Besides, a portion in the vessel 64 distant downward from the heating coil 65 is set into a cooling zone or region. By thus providing the heating and cooling zones vertically, a temperature inclination is formed in the vessel 64.

In the above construction, metal thrown in through the metal throwing-in portion 68 becomes the state of the molten metal M in the injection passage 69 by the heating coil 65. When a gauging portion 63a of the rotational drum 63 is positioned at the injection port 69a of the injection passage 69 as shown in FIG. 19, the molten metal M flows in the storage portion 70 of the pressure P2 from the injection passage 69 of the pressure P1 through the gauging portion 63a. By providing a pressure difference between the inside and outside of the rotational drum 63, the molten metal M can properly be pressurized and filled into the gauging portion 63a. Thereby, the molten metal M can evenly be injected into the gauging portion 63a, and high measurement accuracy can be ensured efficiently.

The gauging portion 63a is thus filled with the molten metal M with high accuracy, and then the rotational drum 63 is driven and rotated. At this time, the outer and inner circumferential surfaces of the rotational drum 63 slide on the outer and inner circumferential surfaces of the respective outer and inner blocks 61 and 62, and consequently, by cutting the molten metal M into the predetermined volume of the gauging portion 63a by rubbing, it can be measured accurately.

Further, the gauging portion 63a filled with this measured molten metal M moves just above the discharge port 71 by the rotation of the rotational drum 63. And, the molten metal M in the gauging portion 63a is discharged into the oil 66 as in the molten state (M1) through the discharge port 71 by the gas pressure of the gas chamber 72. The discharged molten metal M1 descends in the oil 66 of the fluid tank from the heating zone to the cooling zone. In this descent, the molten metal M1 is cooled by the oil 66 to a temperature less than the melting point, and, in this cooling process, it solidifies into a sphere by surface tension, and thereby a minute metallic sphere B of a predetermined size and shape is formed with high accuracy.

By repeating the above operation, a plurality of gauging portions measure molten metals M in order, and minute metallic spheres B can be obtained successively. Accordingly, minute metallic spheres B can be manufactured with very high accuracy and efficiency. In this manner, according to the present invention, minute metallic spheres B having aimed diameters can be manufactured at a high yield, and the manufacturing efficiency is considerably improved. It may be said in this connection that a yield greatly higher than that of a conventional atomization method can be obtained.

Here, a modification of the third embodiment will be described.

As shown in FIG. 19, a plurality of degassing holes 75 can be provided to be isolated from the discharge port 71 in the outer block 61, and suitably to correspond to the respective gauging portions 63a. These degassing holes 75 are connected to a vacuum source through not-shown pipes.

The degassing holes 75 are not always necessary in case of providing the storage portion 70. Consequently, since the molten metal M is transferred by pressure from the injection passage 69 on the high pressure side through a gauging portion 63a to the storage portion 70 on the low pressure side, it can accurately be measured by the predetermined volume of the gauging portion 63a. On the other hand, in case of providing no storage portion 70, if remaining gas or the like is present in the gauging portion 63a, in filling with the molten metal M, it may affect the measurement accuracy. Accordingly, preferably in accordance with the presence of the storage portion 70, the degassing holes 75 should be provided.

The gauging portion 63a from which the molten metal M has been discharged through the discharge port 71, is disposed to correspond to a degassing hole 75 after it passes through the discharge port 71 by the rotation of the rotational drum 63. At this time, the remainder such as a gas in the gauging portion 63a is completely removed through the degassing port 75. Thereby, the purity of the gauging portion 63a after discharging the molten metal M is kept, unevenness of measurements can be avoided, and uniform measurements can always be made with high accuracy.

As the cooling means for the molten metal M, the example of the fluid tank consisting of the oil 66 was described in the above third embodiment, but, other than this, it can be a fluid tank consisting of, e.g., an inert gas such as argon, nitrogen, or helium. Besides, the apparatus of the present invention is not limited to these fluid tanks but it can be used in a vacuum atmosphere.

Next, two examples in which the third embodiment was performed concretely, will be described.

FIRST EXAMPLE

First, the first example will be described. This example is an example of manufacturing metallic spheres having the diameter of 300 μm.

The upper portion of a vessel 64 of a cylindrical tube filled with a vegetable oil as an oil 11 is heated to 220 to 270° C. by a heating coil 65. In this heating zone, a rotational drum 63 having the diameter of 120 mm and the thickness of 1 mm is disposed. In the rotational drum 63, gauging portions 63a made of through holes having the diameter of 0.14 mm and formed on the circumference at pitch intervals of 10 mm, are provided. The rotational drum 63 is set between outer and inner blocks 61 and 62, and a molten metal M is supplied and discharged in relation to the gauging portions 63a through an injection passage 69 and a discharge port 71.

TABLE 3

| NO | metal composition (%) | heating zone temperature (° C.) | yield of metallic spheres of diameter of 280 to 310 μm (%) |
|---|---|---|---|
| 1 | 95Sn-5Pb | 240 | 69 |
| 2 | 60Sn-40Pb | 220 | 70 |
| 3 | 35Sn-65Pb | 260 | 71 |

Table 3 shows results of manufacturing metallic spheres in the first examples. Clearly from the Table 1, in case of the alloy of any metal composition, metallic spheres having aimed diameters could be manufactured at a high yield. As shown in this example, according to the present invention, high manufacturing efficiency can be obtained. It may be said in this connection that the yield of a conventional atomization method is in the degree of 10 to 30% at most.

SECOND EXAMPLE

The second example is an example of manufacturing metallic spheres having the diameter of 300 μm.

A vessel 64 of a cylindrical tube is made into a fluid tank from the lower portion of which helium gas is made to flow in, and the upper portion of the vessel 64 is heated to 360 to 450° C. by a heating coil 65. In this heating zone, a rotational drum 63 having the diameter of 120 mm and the thickness of 1 mm is disposed. In the rotational drum 63, gauging portions 63a made of through holes having the diameter of 0.14 mm and formed on the circumference at pitch intervals of 10 mm, are provided. The rotational drum 63 is set between outer and inner blocks 61 and 62, and a molten metal M is supplied and discharged in relation to the gauging portions 63a through an injection passage 69 and a discharge port 71.

TABLE 4

| NO | metal composition (%) | heating zone temperature (° C.) | yield of metallic spheres of diameter of 280 to 310 μm (%) |
|---|---|---|---|
| 1 | 1.5Sn-96.0Pb-2.5Ag | 350 | 68 |
| 2 | 1.0Sn-97.5Pb-1.5Ag | 380 | 69 |
| 3 | 83.0Sn-7.0Pb-10.0Ag | 450 | 65 |

Table 4 shows results of manufacturing metallic spheres in the second examples. Clearly from the Table 4, in case of the alloy of any metal composition, metallic spheres having aimed diameters could be manufactured at a high yield.

Although examples in which the present invention applied to cases of manufacturing metallic spheres have been described in the above third embodiment, the present invention is not limited to metallic spheres and can apply to cases of manufacturing minute spheres of glass, plastic, or the like, in the same manner, and, in any case, minute spheres can be manufactured with high accuracy and efficiency.

Fourth Embodiment

Next, the fourth embodiment of the present invention will be described.

As described in the above-described embodiments, the molten metal M1 discharged from a measurement unit disposed in the vessel 9, becomes a minute metallic sphere B while it descends in the vessel 9. In the process of lowering the temperature to the normal temperature in order to form the minute metallic sphere B, it is very important for manufacturing the minute metallic sphere B of good quality how temperature history the molten metal M1 is cooled through.

With the drop of a molten metal M at a high-temperature, when hot oil in the upper portion of the oil vessel is drawn downward, the temperature of the lower portion of the oil vessel lowers if it is left as it is. That is, it becomes difficult to cool/solidify the molten metal M1 at a proper temperature. This fourth embodiment is mainly to set/keep the oil temperature in the oil vessel proper.

Figure 21:
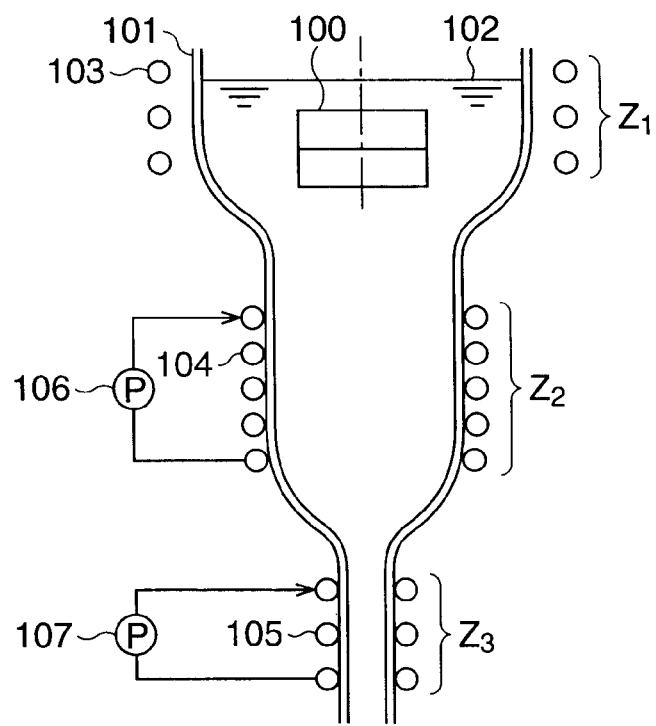
FIG. 21 is a typical view showing a schematic construction of a manufacturing apparatus of minute metallic spheres according to the fourth embodiment of the present invention.

FIG. 21 shows a schematic construction of the apparatus according to this embodiment. In the drawing, an oil 102 is stored in an oil vessel 101, and a measurement unit 100 is disposed in the upper portion in the oil vessel 101. This measurement unit 100 has substantially the same construction as the apparatus including the gauger 6, the upper and lower blocks 3 and 4, etc., described in the above-described embodiment (see FIG. 1). Accordingly, molten metals M1 measured by the measurement unit 100 in the upper portion of the oil vessel 101, are discharged one after another.

A heating coil 103 made of a high-frequency coil or the like, heats metal thrown in the measurement unit 100 and keeps It in a state of molten metal M1. The region in which this heating coil 103 is disposed, ii set to a heating temperature zone or a heating temperature region Z1. One or a plurality of cooling means is provided below the measurement unit 100. In this example, as the cooling means, it includes water-cooling tubes and/or cooling jacket 104 and 105 wound around the oil vessel 101 below the measurement unit 100. In the water-cooling tube 104 or 105, cooling water is circulated by a pump 106 or 107. The regions in which the water-cooling tubes 104 and 105 are disposed, are set to cooling temperature zones or cooling temperature regions Z2 and Z3.

By thus providing the water-cooling tubes and/or cooling jacket 104 and 105, the oil 102 is prevented from becoming a high temperature even when the molten metal M1 discharged from the measurement unit 100, moves downward, and it is kept at a predetermined low temperature. At this low temperature, because the viscosity of the oil 102 becomes large and its flowability becomes small, a proper temperature distribution along a vertical direction of the oil vessel 101 can be ensured stably. It is possible to cool the molten metal M1 by temperatures less than the melting point in the cooling temperature zones Z2 and Z3, and to solidify the molten metal M1 into a sphere in this cooling process.

Particularly in case of forming a solder minute metallic sphere B having a diameter of 300 to 1000 μm, a large quantity of heat tends to be transferred downward if the discharge quantity of molten metal M1 exceeds 15 g/min. But, even in such a case, the oil temperature in the oil vessel 101 can be set/kept properly by the water-cooling tubes 104 and 105.

In case of the above, though two cooling temperature zones Z2 and Z3 are set as the example shown in the drawing, the number of cooling temperature zones to be set can be increased or decreased in a relation with the size of the minute metallic sphere B, the discharge quantity of molten metal M1, or the like.

Figure 22:
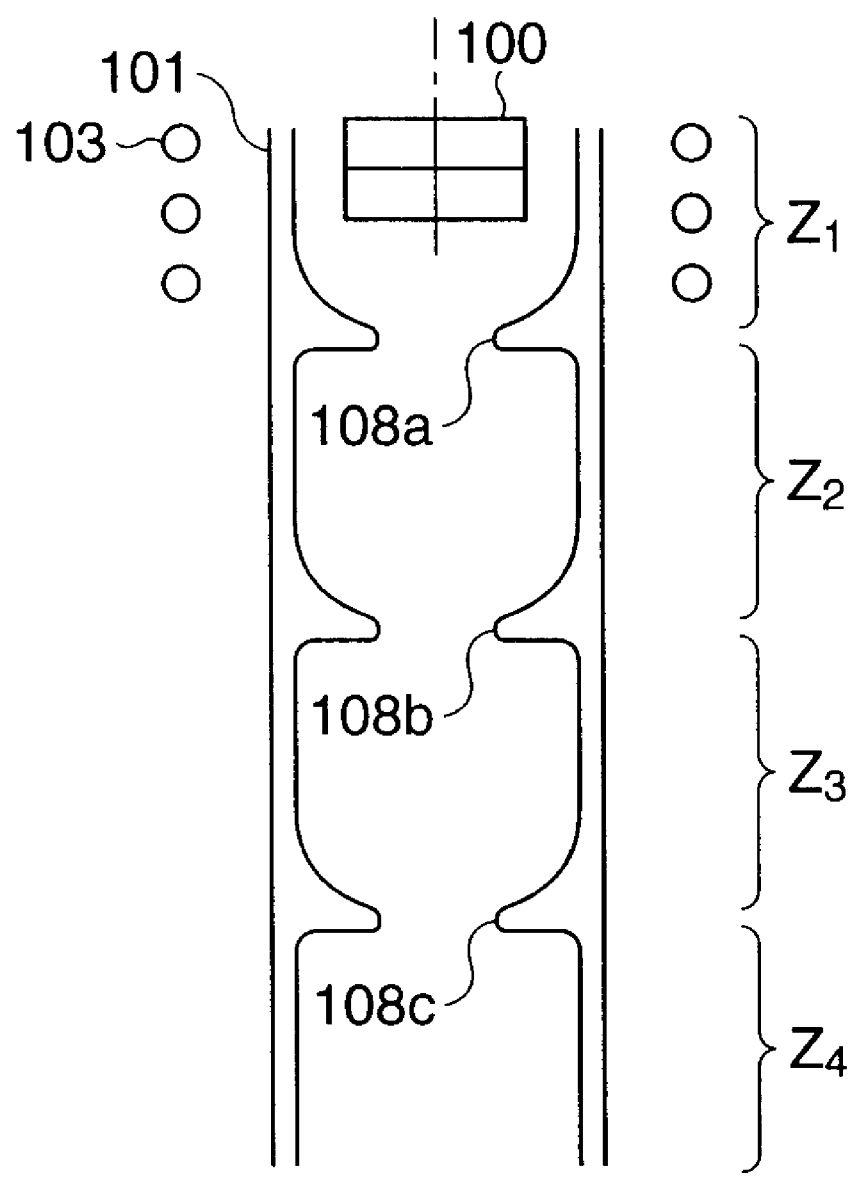
FIG. 22 is a typical view showing a schematic construction of a manufacturing apparatus of minute metallic spheres according to a modification of the fourth embodiment of the present invention.

Next, FIG. 22 shows a modification of the fourth embodiment. It has one or a plurality of moving-flow regulation means for physically regulating a convection of the oil 102 in the oil vessel 101, below the measurement unit 100. In this example, as the moving-flow regulation means, it includes projecting pieces 108 formed on the inner wall of the oil vessel 101 below the measurement unit 100 to project. In the example shown in the drawing, three projecting pieces 108a, 108b, and 108c are disposed, and made into pent roof shapes. The projecting pieces 108 may be formed continuously or intermittently along the inner circumference of the oil vessel 101.

By thus providing the projecting pieces 108, with the drop of a molten metal M1 at a high-temperature, the oil 102 at a high temperature moving downward or the oil 102 at a low temperature in the lower portion of the oil vessel 101 ascending by the moving flow is suppressed. Each projecting piece 108a, 108b, or 108c regulates a convection of the oil 102 in the oil vessel 101, and a cooling temperature zone Z2, Z3, or Z4 can be set at each projecting piece 108, as shown in the drawing. A proper temperature distribution can be obtained.

Figure 23A:
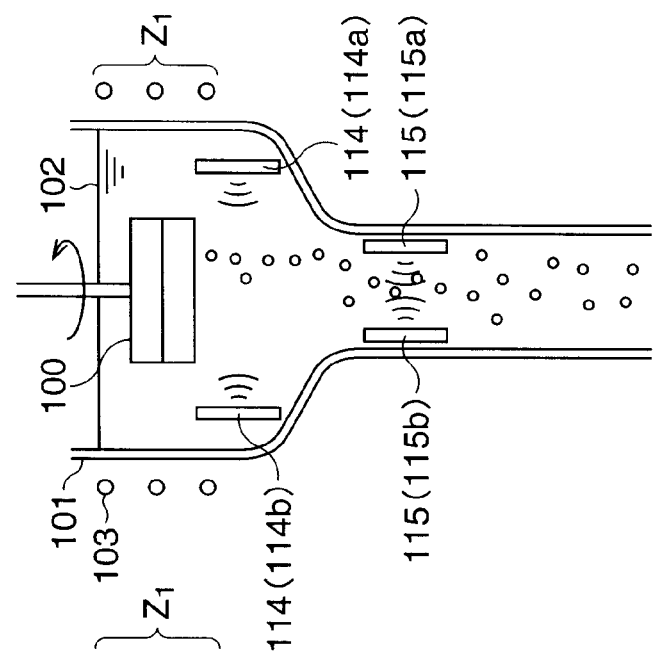
FIGS. 23A to 23C are typical views showing schematic constructions of manufacturing apparatus of minute metallic spheres according to other modifications of the fourth embodiment of the present invention.
Figure 23B:
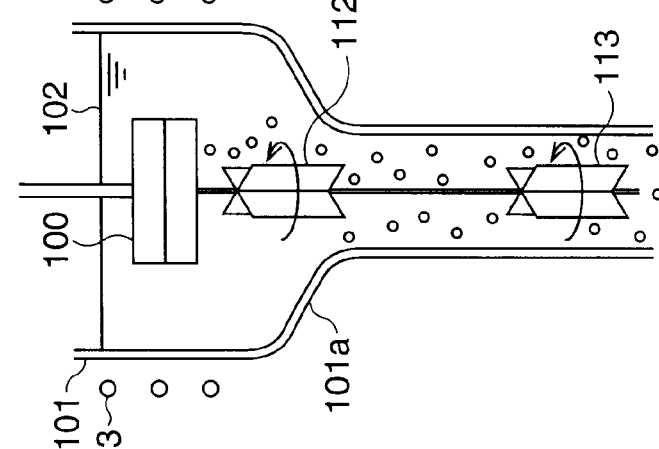
Figure 23C:
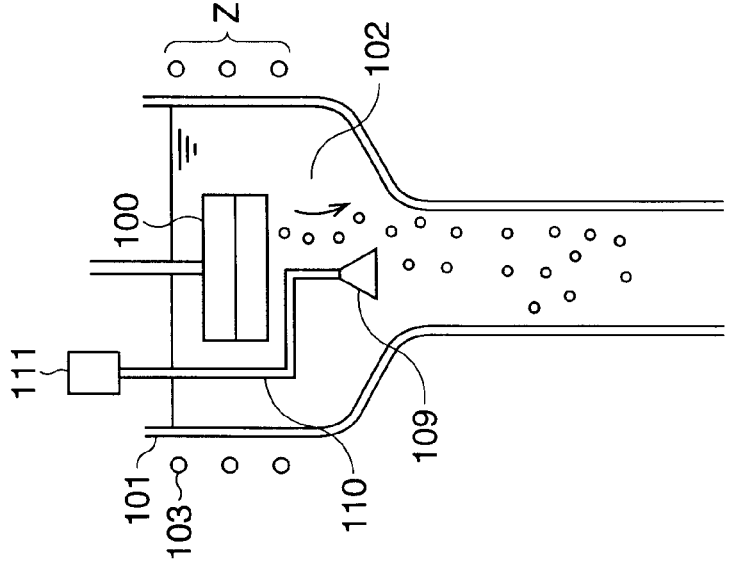

Besides, FIGS. 23A to 23C show other modifications. This example mainly comprises a dispersion means for the molten metal M1 in the oil 102.

As the dispersion means, a bell-like member 109 of a trigonal pyramid shape is disposed at a position below the measurement unit 100, as shown in FIG. 23A. The bell-like member 109 is typically formed into a shape widening downward. Besides, the bell-like member 109 is held at a predetermined position of the oil vessel 101 by a support mechanism 110, and is to be given a vertical oscillation and a rotational movement by a drive mechanism 111.

First, by providing the bell-like member 109, with the drop of a molten metal M1 at a high-temperature, the oil 102 at a low temperature in the lower portion of the oil vessel 101 ascending by a moving flow of the oil 102 at a high temperature is suppressed. The bell-like member 109 regulates a convection of the oil 102 in the oil vessel 101, and a proper temperature distribution can be obtained.

Here, when a molten metal M1 at a high-temperature drops, one line of oil moving-flow arises along the drop path from the upper portion toward the lower portion of the oil vessel 101 if it is left as it is. In the portion of this oil moving-flow, the viscosity of the oil 102 becomes small because of the high temperature, and the molten metal M1 concentrates in one portion of this portion to form a passage for heat from the upper portion toward the lower portion of the oil vessel 101. Such an oil moving-flow at a high-temperature is undesirable because it destroys a proper temperature distribution or balance in the oil vessel 101.

In such a case, by providing the bell-like member 109, the molten metal M1 at a high-temperature discharged from the measurement unit 100 can be dispersed so as not to concentrate in one portion, as shown in FIG. 23A. Consequently, by giving the bell-like member 109 a vertical oscillation and a rotational movement by the drive mechanism 111, the molten metal M1 can be dispersed effectively. By dispersing the molten metal M1, forming a passage for heat as described above is prevented and the temperature distribution is made stable, and molten metals M1 are prevented from uniting with each other. At 183° C. or more in case of SnPb eutectic solder, and at a temperature more than the solidus line in case of solder other than that, the molten metals M1 are prevented from uniting with each other.

Besides, in another modification, as shown in FIG. 23B, as the dispersion means, it has propeller stirrers 112 and 113 at a position below the measurement unit 100 or near a middle position of the oil vessel 101. The propeller stirrers 112 and 113 are to be given a rotational movement around a vertical axis by a not-shown drive mechanism. In this example, the propeller stirrer 112 is disposed near the lower portion of the heating temperature zone Zl, and the propeller stirrer 113 is disposed downward at a predetermined distance from the propeller stirrer 112.

First, by providing the propeller stirrers 112 and 113 having a stirring function, the oil 102 in the oil vessel 101 can be stirred. Particularly in case of having a step portion 101a near the lower portion of the heating temperature zone Zl as this example, by the propeller stirrer 112 rotating, the movement of the oil 102 between zones, that is, a convection of the oil 102 that is to move from the lower part thereof to the heating temperature zone Zl, can be suppressed, and each zone can be set/kept at a proper temperature.

Besides, by providing the propeller stirrers 112 and 113, by stirring the oil 102 at a temperature more than the solidus line, the molten metal M1 at a high-temperature discharged from the measurement unit 100 can be dispersed in the oil 102. By thus dispersing the molten metal M1, it is prevented from concentrating in one portion, and molten metals M1 can be prevented from uniting with each other. At 183° C. or more in case of SnPb eutectic solder, and at a temperature more than the solidus line in case of solder other than that, the molten metals M1 are prevented from uniting with each other.

Besides, in another modification, as shown in FIG. 23C, as the dispersion means, it includes supersonic oscillators 114 (114a and 114b) and 115 (115a and 115b) at a position below the measurement unit 100 or near a middle position of the oil vessel 101. The supersonic oscillators 114 and 115 are to oscillate supersonic waves by a not-shown drive device. In this example, the supersonic oscillator 114 is disposed near the lower portion of the heating temperature zone Zl, and the supersonic oscillator 115 is disposed downward at a predetermined distance from the supersonic oscillator 114. The oscillation direction by these supersonic oscillators 114 and 115 is suitably a horizontal direction from the inner wall of the oil vessel 101 toward a vicinity of the central portion.

By providing the supersonic oscillators 114 and 115 having an oscillation function, by applying supersonic waves in the oil 102 at a temperature more than the solidus line, the molten metal M1 at a high-temperature discharged from the measurement unit 100 can be dispersed in the oil 102. By thus dispersing the molten metal M1, it is prevented from concentrating in one portion, and molten metals M1 can be prevented from uniting with each other. At 183° C. or more in case of SnPb eutectic solder, and at a temperature more than the solidus line in case of solder other than that, the molten metals M1 are prevented from uniting with each other.

Fifth Embodiment

Next, the fifth. embodiment of the present invention will be described.

A minute metallic sphere B is used for forming a bump on an electrode of a semiconductor device or the like. It is important that the molten metal M used in each of the above embodiments, does not contain inclusion, oxide, or the like, (hereinafter, simply called inclusion), and has a high purity, in order to form a minute metallic sphere B of good quality.

This embodiment is to obtain a molten metal M at a high purity as a material for forming a minute metallic sphere B, from a material metal.

Figure 24:
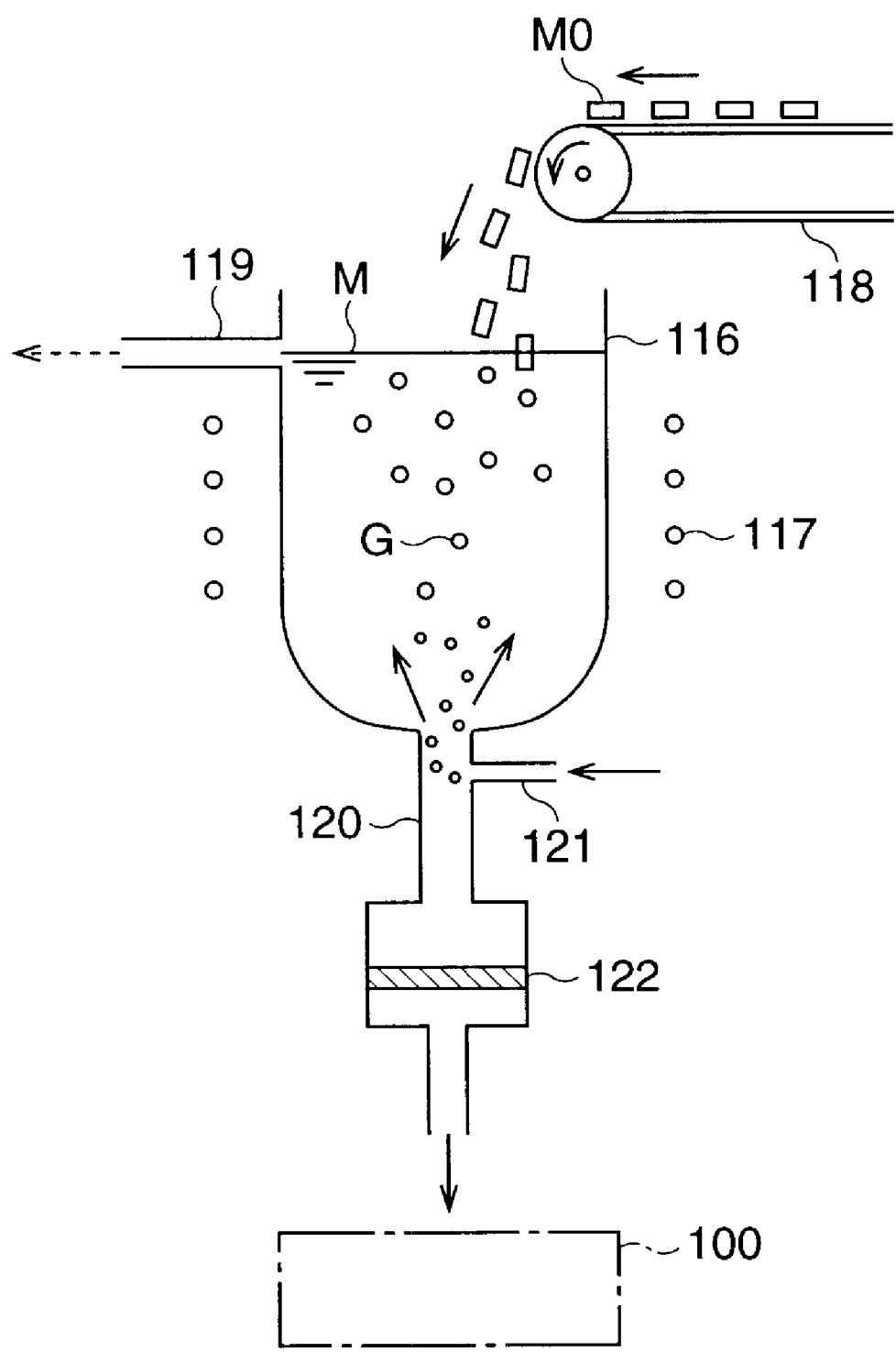
FIG. 24 is a typical view showing a schematic construction of a manufacturing apparatus of minute metallic spheres according to the fifth embodiment of the present invention.

FIG. 24 shows a schematic construction of an apparatus according to this embodiment. This apparatus is disposed before a measurement unit 100, and supplies a molten metal M to the measurement unit 100. In the drawing, 116 denotes a pot for storing the molten metal M, and 117 denotes a heating coil made of a high-frequency coil or the like to set/keep the interior of the pot 116 at a temperature more than the melting point of a material metal (solder material) M0. The material metal M0 is conveyed by a conveyer 118 to the upper portion of the pot 116, and thrown in the pot 116.

Besides, in the drawing, 119 denotes an overflow hole or pipe for discharging inclusion, provided near the upper portion of the pot 116, 120 denotes a supply pipe for a molten metal M, connected to the lower end of pot 116, 121 denotes an inert gas supply hole or pipe connected to the middle of the supply pipe 120, and 122 denotes a ceramic filter provided below the inert gas feed pipe 121. The mesh size of the ceramic filter 122 is preferably 0.2 $\mu$m or less.

An inert gas (may be argon gas, helium gas, or the like) fed from the inert gas feed pipe 121, is blown out through the bottom portion of the pot 116, and ascends in the molten metal M. Inclusion in the molten metal M is caught by the inert gas ascending in the molten metal M. And, it surfaces on the liquid surface of the molten metal M, and is discharged through the overflow pipe 119. By inclusion being caught/discharged, the molten metal M in the pot 116 is purified gradually.

The molten metal M in the pot 116 then passes through the ceramic filter 122, and is supplied to the measurement unit 100 by the supply pipe 120. By removing inclusion and further passing through the ceramic filter 122, the molten metal M having a very high purity can be obtained. For comparing with a wire cut ball formed using a normal solder material, when a section of a minute metallic sphere B manufactured according to the present invention was analyzed, in comparison with the content of inclusion of 100 ppm level contained in the former, it could be decreased to the degree of 10 ppm level according to the present invention. By using a molten metal of high purity, a minute metallic sphere B with very good joinablity to an electrode of a semiconductor device, or the like, can be formed.

Although the present invention has been described with reference to the examples of concrete numerical values or the examples shown in the drawings in the above embodiments, the present invention is not limited to only those examples shown in the drawings, or the like, but can be variously modified or the like within the scope of the present invention.

For example, the disposed positions or the quantity of the cooling means, the moving-flow regulation means, or the like, in the above embodiments, can be properly changed at need. Besides, the concrete shapes or the like of the bell-like member, the propeller stirrer, or the like, can employ other shapes properly.

Sixth Embodiment

Hereinafter, a preferred embodiment of method and apparatus for manufacturing minute metallic spheres according to the sixth example of the present invention will be described on the basis of drawings.

As described in each of the above-described embodiments, after the process of lowering the temperature of the molten metal M1 using a cooling medium such as an oil for forming a minute metallic sphere B, is performed, it is necessary to remove the cooling medium from the surface of the minute metallic sphere B. This is because the joinability in joining by reflow to a semiconductor chip, substrate, or the like, deteriorates if it is left in the state that the cooling medium such as an oil adheres.

The sixth embodiment is to make it possible easily to remove the cooling medium from the surface after a minute metallic sphere B is formed.

Figure 25:
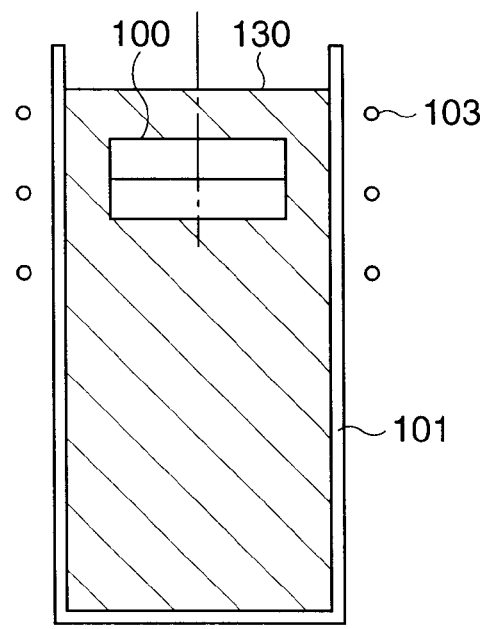
FIG. 25 is a typical view showing a schematic construction of a manufacturing apparatus of minute metallic spheres according to the sixth embodiment of the present invention.

FIG. 25 is a typical view showing a manufacturing apparatus of minute metallic spheres B according to the sixth embodiment. In FIG. 25, a liquid cooling medium (fluorine-type high-molecular liquid 130) is put in a vessel 101. A measurement unit 100 is disposed in the upper portion of the vessel 101. Molten metals M1 are discharged one after another from this measurement unit 100, like each of the above-described embodiments. The discharged molten metal M1 is made into a sphere in the cooling medium by surface tension.

A heating coil 103 made of a high-frequency coil or the like is disposed around the vessel 101. Also in the manufacturing apparatus of minute metallic spheres B of this embodiment, a predetermined cooling means such as a water-cooling tube and/or cooling jacket is provided so as to form a predetermined temperature inclination from the position at which the measurement unit 100 is disposed, toward the lower part, but it is omitted in the drawing here.

The cooling medium in this embodiment is made of a fluorine-type high-molecular liquid (fluorine-type inert liquid) 130, and put in from the bottom of the vessel 101 to the upper portion of measurement unit 101. The fluorine-type high-molecular liquid 130 is a liquid having a chemical formula of, e.g., $(C_5F_{11})_{3n}$, and has a specific gravity in the degree of 1.2 or more. In the fluorine-type high-molecular liquid 130, the greater the specific gravity is, the more the number of substitutions of fluorine is. As an example of such a fluorine-type high-molecular liquid 130, the trade name Frorinate made by Sumitomo 3M Limited can be given.

The molten metal M1 measured by the measurement unit 100 is discharged in the fluorine-type high-molecular liquid 130 in the vessel 101 as it is in the molten state. The discharged molten metal M1 drops downward in the fluorine-type high-molecular liquid 130 as it is made into a sphere. Because the boiling point of the fluorine-type high-molecular liquid 130 is stable in the degree of 150° C. to 215° C. and it does not react with solder or the like constituting the molten metal M1, the molten metal M1 is cooled in accordance with the temperature inclination of the fluorine-type high-molecular liquid 130 as it is dropping downward in the vessel 101. And, about the time when the discharged molten metal M1 reaches the bottom of the vessel 101, the molten metal M1 has solidified to form a minute metallic sphere B.

The molten metal M1 having become a solid is taken out from the fluorine-type high-molecular liquid 130, and cleaned. Because the fluorine-type high-molecular liquid 130 is superior in cleanability, the fluorine-type high-molecular liquid 130 adhering to the surface of the minute metallic sphere B can easily be removed by using alcohol such as ethanol, or acetone.

The high-molecular liquid is not limited to fluorine-type, but various inert high-molecular liquids can be used.

Besides, it may be one in which several kinds of inert high-molecular liquids are mixed. Besides, for example, it may be one in which several kinds of inert high-molecular liquids different in the above-described number of substitutions of fluorine are mixed.

Besides, although the manner that the molten metal M1 discharged from the measurement unit 100 is cooled by the liquid fluorine-type high-molecular liquid 130, it is also possible that the vessel 101 is filled with gas (steam) of the fluorine-type high-molecular liquid 130 and the molten metal M1 discharged in the gas atmosphere is cooled. In this case, it is desirable that a liquid cooling medium is further put in below the gas to perform further cooling.

As described above, according to the sixth embodiment of the present invention, by discharging the molten metal M1 in the fluorine-type high-molecular liquid 130 as a cooling medium, cleaning after solidifying can easily be performed, and it becomes possible to simplify the cleaning process.

Next, a preferred embodiment of method and apparatus for manufacturing minute metallic spheres according to an modification of the sixth embodiment of the present invention will be described on the basis of drawings.

The modification of the sixth embodiment is also to make it possible easily to remove a cooling medium after a minute metallic sphere B is formed like the sixth embodiment.

Figure 26:
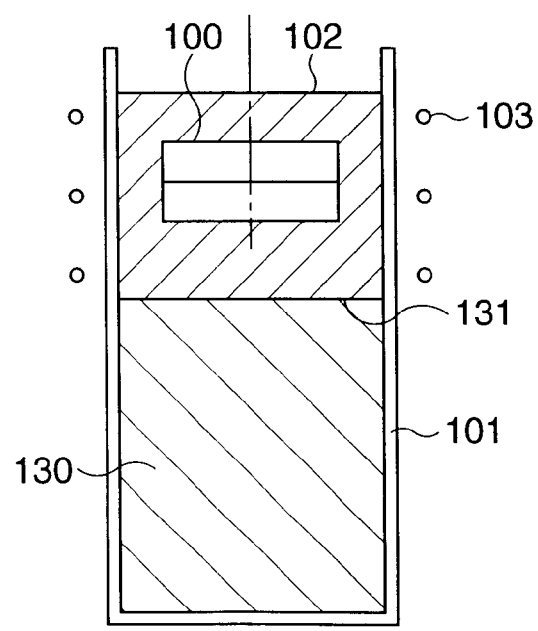
FIG. 26 is a typical view showing a schematic construction of the manufacturing apparatus of minute metallic spheres according to the sixth embodiment of the present invention.

FIG. 26 is a typical view showing a manufacturing apparatus of minute metallic spheres B according to the modification of the sixth embodiment. In FIG. 26, a cooling medium consisting of two kinds of liquids is put in a vessel 101. That is, in the vessel 101, such an oil 102 as described in the above first to fifth embodiments and such a fluorine-type high-molecular liquid 130 as described in the sixth embodiment, are put in. Because the fluorine-type high-molecular liquid 130 has a specific gravity of 1.2 or more as described above, and the oil 102 has a specific gravity in the degree of 0.8, both separate at a boundary 131 so that the oil 102 is positioned on the upper portion of the fluorine-type high-molecular liquid 130.

A molten metal M1 discharged from the measurement unit 100 is first discharged in the oil 102. The oil 102 is kept at a predetermined temperature by the heating coil 103 disposed outside the vessel 101, where the molten metal M1 is made into a sphere by surface tension in the oil 102.

After this, the molten metal M1 drops downward in the oil 102, and soon gets beyond the boundary 131 surface to the fluorine-type high-molecular liquid 130, and drops in the fluorine-type high-molecular liquid 130. Also in the fluorine-type high-molecular liquid 130, a predetermined temperature inclination is set downward by the heating coil 103, a cooling tube, or the like, the molten metal M1 solidifies as it is dropping downward. At the same time, the oil 102 adhering to the surface of the molten metal M1 comes off in the fluorine-type high-molecular liquid 130, and the surface of the molten metal M1 is covered with the fluorine-type high-molecular liquid 130.

That is, by transferring the molten metal M1 from the oil 102 into the fluorine-type high-molecular liquid 130, the oil 102 adhering to the surface of the molten metal M1 can completely be removed. The molten metal M1 having solidified into a solid is taken out from the fluorine-type high-molecular liquid 130, and cleaned. Because the fluorine-type high-molecular liquid 130 is superior in cleanability, the fluorine-type high-molecular liquid 130 adhering to the surface of the minute metallic sphere B can easily be removed by using alcohol such as ethanol, or acetone. Accordingly, differently from the case of cooling only with the oil 102, it becomes possible easily to perform cleaning after the molten metal M1 has solidified to form a minute metallic sphere B.

As shown in FIG. 26, the oil 102 and the fluorine-type high-molecular liquid 130 separate completely at the boundary 131 because of the difference in specific gravity. Besides, if the fluorine-type high-molecular liquid 130 is made to contain alcohol such as methanol or ethanol, soil such as oil adhering to the surface of the molten metal M1, can be decomposed by alcohol, and, in addition, because alcohol and the fluorine-type high-molecular liquid 130 separate, by removing components such as soil together with alcohol from the fluorine-type high-molecular liquid 130, it becomes possible to regenerate the fluorine-type high-molecular liquid 130.

As described above, according to the modification of the sixth embodiment, after discharging a molten metal M1 from the measurement unit 100 into the oil 102, by transferring it into the fluorine-type high-molecular liquid 130, the oil 102 adhering to the surface of the molten metal M1 can be removed, and it becomes possible easily to perform cleaning after solidification.

Seventh Embodiment

Hereinafter, a preferred embodiment of method and apparatus for manufacturing minute metallic spheres according to the seventh embodiment of the present invention will be described on the basis of drawings.

As described in each of the above embodiments, e.g., in the sixth embodiment, the molten metal M1 discharged from the measurement unit 100 drops downward in a cooling medium such as oil, and is cooled with dropping by the temperature inclination of the cooling medium set by the heating coil 103, a cooling tube, or the like, to become a minute metallic sphere B.

Here, the dropping speed of the molten metal M1 in the cooling medium greatly affects on the sphericity when the molten metal M1 has solidified to become a minute metallic sphere B, and the sphericity deteriorates due to the resistance of the cooling medium when the speed is large. Accordingly, it is very important for manufacturing a minute metallic sphere B of good quality to control properly the dropping speed in the cooling medium. The seventh embodiment is to control the dropping speed in the cooling medium and to improve the sphericity of the minute metallic sphere B.

As described before, the manufactured minute metallic sphere B is used as a bump for connecting an electrode portion of a semiconductor element and an external circuit or the like in a manufacturing process of a semiconductor device. The size of the minute metallic sphere is determined in accordance with the sizes of the respective electrodes of the semiconductor element and the external circuit, or the like, and various sizes of minute metallic spheres are used in accordance with application/object.

Here, because the dropping speed in the cooling medium is in proportion to the square of the radius of the minute metallic sphere B, when minute metallic spheres B having sizes in the degree of 100 μm in diameter, are manufactured, the dropping speeds little affect on the sizes of the minute metallic spheres B.

But, according to a kind of semiconductor device, minute metallic spheres B having diameters in the degree of 400 μm to 800 μm, are used, and, in case of forming such a relatively large minute metallic sphere B, it is required in particular to control the dropping speed in the cooling medium.

In this embodiment, when minute metallic spheres B having diameters in the degree of 400 μm to 800 μm, are manufactured, an oil whose viscosity becomes high near the melting point of the minute metallic spheres B, is used.

Figures 27, 28, 29:
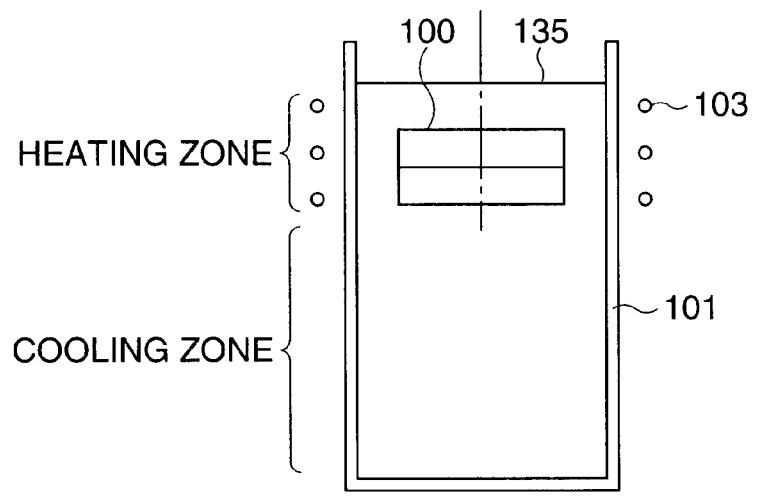
FIG. 27 is a typical view showing a schematic construction of a manufacturing apparatus of minute metallic spheres according to the seventh embodiment of the present invention.
FIG. 28 is a typical view showing characteristics of oils in the seventh embodiment.
FIG. 29 is a typical view showing the characteristic of an ordinary oil as a comparative example.

FIG. 27 is a typical view showing the construction of a manufacturing apparatus of minute metallic spheres B according to the seventh embodiment. As shown in FIG. 27, also in the manufacturing apparatus of minute metallic spheres B according to the seventh embodiment, it comprises a vessel 101, a measurement unit 100 disposed in the vessel 101, and an oil 135 put in the vessel 101 and put in to the upper portion of the measurement unit 100. Besides, a heating coil 103 is disposed on the outer circumference of the vessel 101.

As shown in FIG. 27, the oil 135 put in the oil 135 is heated to a predetermined temperature by the heating coil 103 in a heating zone, and forms a downward temperature inclination by a member such as a not-shown cooling tube in a cooling zone. Here, the dropping speed becomes a problem mainly in the upper portion of the cooling zone.

Because, in general, the higher the temperature is, the lower the viscosity of oil is, decrease in dropping speed due to decrease in viscosity becomes remarkable particularly near the cooling zone set to a temperature near the melting point of the molten metal M1.

FIG. 28 is a typical result showing the characteristic of oils 135 in the seventh embodiment. Besides, FIG. 29 shows the characteristic of an ordinary oil for comparison. Here, FIGS. 28 and 29 show the viscosity at temperatures of 40° C., 100° C., and 200° C.

As shown in FIG. 28, the oils 135 used in this embodiment are three kinds shown in ① to ③ for example, and the viscosity is set in the range of 8 cSt to 7.6 cSt at 200° C. On the other hand, in the ordinary oil ④ as shown in FIG. 29, the viscosity at 200° C. is in the degree of 1.0 cSt. In the viscosity of 1.0 cSt, a minute metallic sphere B having a diameter of 400 μm to 800 μm drops at a very high dropping speed, and change of the sphericity becomes great due to the resistance at this time, but, by using an oil having a viscosity more than the degree of 6 to 7 cSt at 200° C. as this embodiment, it becomes possible to decrease the dropping speed of the molten metal M1 discharged from the measurement unit 100. The above viscosity may be ensured by mixing several kinds of oils different in viscosity as the oil 135, and the above viscosity may be ensured by mixing a viscosity improver in.

Figure 30A:
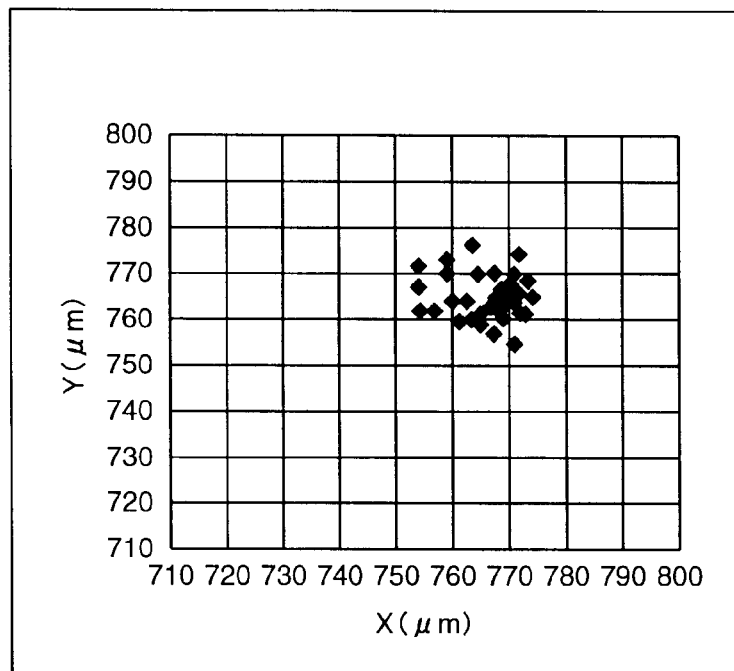
FIGS. 30A and 30B are typical views showing the sphericities of minute metallic spheres in the seventh embodiment.
Figure 30B:
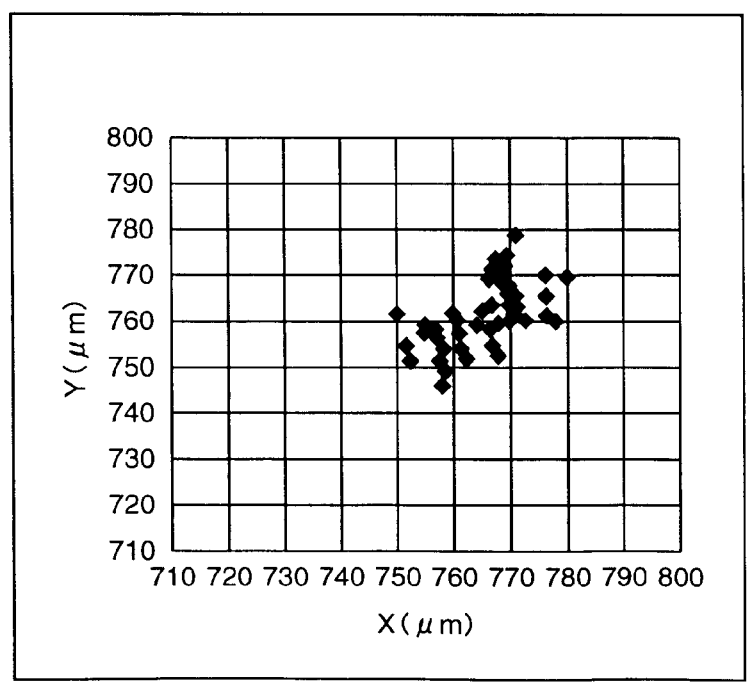

FIG. 30A shows sphericities in case of using the oil 135 of ① shown in FIG. 28. Besides, FIG. 30B shows sphericities in case of using the oil shown in FIG. 29. Thus, by increasing the viscosity at 200° C., the sphericity of a completed minute metallic sphere B can be improved.

On the other hand, in the lower portion of the cooling zone, that is, in the lower portion of the vessel 101, because a solidified minute metallic sphere B must be taken out, there can not be used an oil having a high viscosity. In this embodiment, as shown in FIG. 28, because an oil having a viscosity in the degree of 100 cSt to 400 cSt at 40° C. is used, it becomes possible to take out the solidified minute metallic sphere B. In general, if the viscosity at a high temperature is great, because the viscosity at a low temperature is also great, it is supposed that a hindrance arises in taking out. For example, when the viscosity is in the degree of 1000 cSt, the oil becomes syrupy, and it is difficult to take out a minute metallic sphere B from there. In the oil 135 used in this embodiment, in spite of a great viscosity at 200° C. for decreasing the dropping speed, the viscosity at 40° C. is suppressed to the degree of 400 cSt or less. Accordingly, a predetermined viscosity at which the dropping speed can be suppressed to a small value, can be ensured in the upper portion of the cooling zone, and it can be a low viscosity necessary for taking out in the lower portion of the cooling zone.

As described above, according to the seventh embodiment of the present invention, it becomes possible to decrease the dropping speed of the molten metal M1 discharged from the measurement unit 100. Accordingly, it becomes possible to manufacture a minute metallic sphere B whose sphericity has been improved.

Besides, because the viscosity of the oil 135 is set such that the viscosity at a low temperature is not greater than a predetermined value even when the viscosity at a high temperature is great, it becomes possible easily to take out a solidified minute metallic sphere B from the oil 135.

Eighth Embodiment

Figure 31:
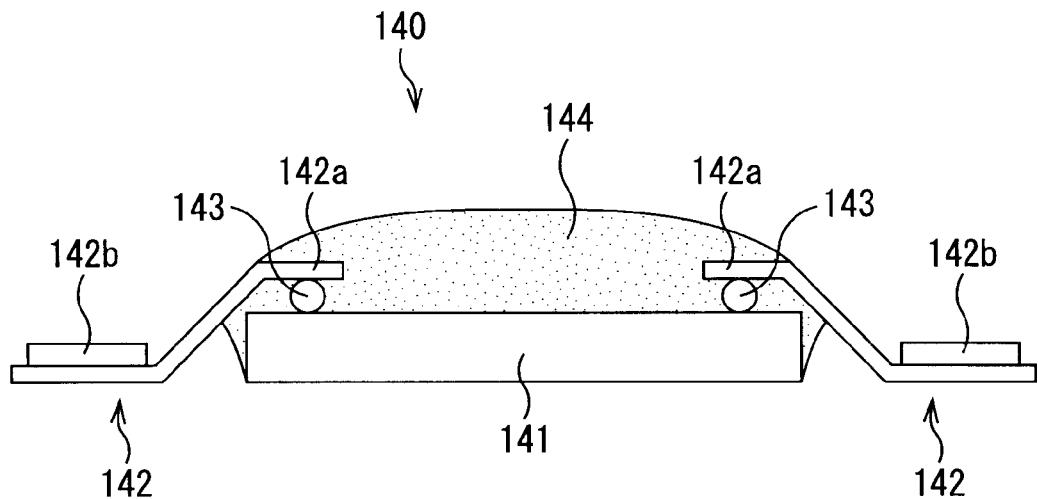
FIG. 31 is a typical view showing the construction of a semiconductor device according to the eighth embodiment.

Next, the eighth embodiment of the present invention will be described. The eighth embodiment is that minute metallic spheres B in the above embodiments are applied to a semiconductor device. FIG. 31 is a schematic sectional view showing the construction of a semiconductor device according to this embodiment. The semiconductor device 140 according to this embodiment is that a semiconductor chip 141 and a substrate 142 are connected through minute metallic spheres 143.

The substrate 142 shown in FIG. 31 is a TAB tape, and consists of leads 142a and a film base 142b. The semiconductor chip 141 is that circuits are formed on a semiconductor substrate such as silicon by an ordinary process.

The minute metallic spheres 143 are disposed on the semiconductor chip 141 or the substrate 142, and the semiconductor chip 141 and the substrate 142 are connected through the minute metallic spheres 143 by, e.g., reflow. It is packaged with a sealing resin 144 in the state that the semiconductor chip 141 and the substrate 142 are connected. In this semiconductor device 140, because connecting by wire bonding is not performed, the package of the semiconductor device 140 can be formed without excessively enlarging from the outer shape of the semiconductor chip 141.

Figure 32:
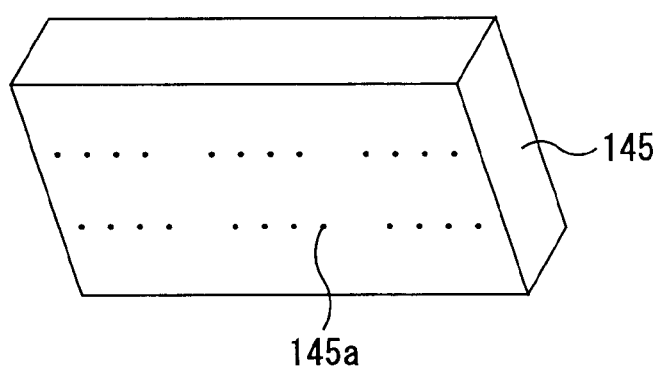
FIG. 32 is a typical view showing a method of arranging minute metallic spheres in a manufacturing method of the semiconductor device according to the eighth embodiment.
Figure 32:
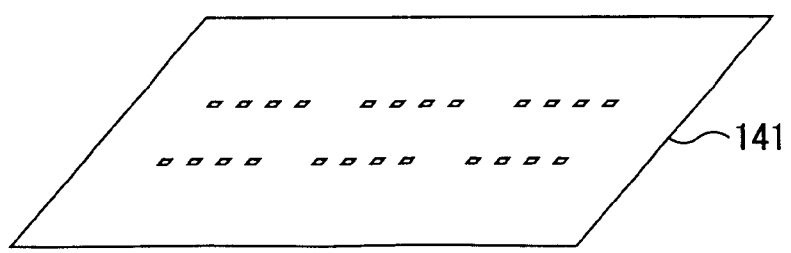

Disposition of the minute metallic spheres 143 on the semiconductor chip 141 can be performed by, e.g., the method shown in FIG. 32. A mold 145 made of a stainless thin plate in which through holes 145a having a diameter slightly smaller than the diameter of the minute metallic spheres 143 are opened so as to correspond to the positions of electrodes on the semiconductor chip 141 or the substrate 142, is prepared, and, by sucking the portion of the through holes 145a of this mold by a vacuum pump, the minute metallic spheres 143 are adsorbed to the positions of through holes 145a, and, after the minute metallic spheres 143 disposed on the mold 145 are placed on the electrodes on the semiconductor chip 141 or the substrate 142, suction is stopped to dispose the minute metallic spheres 143 on the electrodes.

As described above, according to the eighth embodiment of the present invention, by forming the minute metallic spheres by methods and apparatus of the first to seventh embodiments, and using them for connecting the semiconductor chip 141 and the substrate 142 of the semiconductor device 140, miniaturization of the package of the semiconductor device 140 can be attained, and the manufacturing cost can be lowered.

What is claimed is:

1. A manufacturing method for manufacturing minute metallic spheres of a predetermined size, including
    a step of heating and melting a metal to form a metallic sphere, and injecting the molten metal in a gauger,
    a step of removing substantially all gasses from said gauger,
    a step of limiting the volume of molten metal injected in said gauger to a predetermined volume, and
    a step of discharging the measured molten metal from the gauger, and cooling the molten metal to a temperature less than the melting point to solidify.

2. A manufacturing method of minute metallic spheres described in claim 1, wherein
    the molten metal injected in said gauger is cut by rubbing a surface of said gauger by rotating or sliding said gauger over a flat surface thereby limiting said volume to a space between surfaces of said gauger.

3. The manufacturing method of minute metallic spheres described in claim 1, wherein the gasses are removed from said gauger by a degassing port.

4. A manufacturing method for manufacturing minute metallic spheres of a predetermined size, comprising:
    heating and melting a metal and injecting the molten metal in a measurement means formed in a plate by pressurizing,
    substantially removing all gasses from said molten metal in said measurement means,
    limiting the molten metal injected in the measurement means to a predetermined volume by sliding said plate across a flat surface, and
    discharging the measured molten metal from the measurement means by a fluid pressure, and cooling the molten metal to a temperature less than the melting point to solidify said molten metal.

5. A manufacturing method of minute metallic spheres described in claim 4, wherein,
    when the molten metal is injected, it is pressurized and supplied at a high pressure from one side of the measurement means, and the other side opposite to it is set to a low pressure.

6. A manufacturing method of minute metallic spheres described in claim 4, wherein
    the molten metal injected in said measurement means is cut by rubbing a surface of said molten metal by rotating said measurement means against a surface.

7. A manufacturing method of minute metallic spheres described in claim 4, wherein
    the molten metal in said measurement means is discharged and cooled in a fluid at a temperature less than the melting point, and solidified into a sphere in the cooling process.

8. The manufacturing method of minute metallic spheres described in claim 4, wherein all the gasses are substantially removed from said gauger by a degassing port.

* * * * *